(12) United States Patent
Oikawa et al.

(10) Patent No.: US 11,101,407 B2
(45) Date of Patent: Aug. 24, 2021

(54) LIGHT EMITTING DEVICE SEALED IN A FIBROUS BODY TO IMPROVE MANUFACTURABILITY AND ELECTRONIC DEVICE INCLUDING THE LIGHT EMITTING DEVICE

(71) Applicant: Semiconductor Energy Laboratory Co., Ltd., Kanagawa-ken (JP)

(72) Inventors: Yoshiaki Oikawa, Tochigi (JP); Shingo Eguchi, Tochigi (JP); Mitsuo Mashiyama, Oyama (JP); Masatoshi Kataniwa, Kanuma (JP); Hironobu Shoji, Tochigi (JP); Masataka Nakada, Utsunomiya (JP); Satoshi Seo, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 154 days.

(21) Appl. No.: 16/270,252

(22) Filed: Feb. 7, 2019

(65) Prior Publication Data

US 2019/0189856 A1    Jun. 20, 2019

Related U.S. Application Data

(63) Continuation of application No. 16/120,851, filed on Sep. 4, 2018, now Pat. No. 10,205,062, which is a
(Continued)

(30) Foreign Application Priority Data

Jul. 10, 2008    (JP) .................................. 2008-180781

(51) Int. Cl.
*H01L 33/44*    (2010.01)
*H01L 51/00*    (2006.01)
(Continued)

(52) U.S. Cl.
CPC ............ *H01L 33/44* (2013.01); *H01L 51/003* (2013.01); *H01L 51/524* (2013.01);
(Continued)

(58) Field of Classification Search
CPC ......... H01L 2251/5338; H01L 27/3246; H01L 51/0097; H01L 51/524
See application file for complete search history.

(56) References Cited

U.S. PATENT DOCUMENTS 4,792,481 A * 12/1988 O'Connor ................. B32B 5/26
428/300.7
4,943,472 A * 7/1990 Dyksterhouse ......... B29B 15/12
156/307.4
(Continued)

FOREIGN PATENT DOCUMENTS

CN    001700823 A    11/2005
EP    0 939 441 A2    9/1999
(Continued)

OTHER PUBLICATIONS

Motoki_JP2006-259049_machine_translation.pdf (Year: 2006).*
(Continued)

*Primary Examiner* — Tracie Y Green
(74) *Attorney, Agent, or Firm* — Husch Blackwell LLP

(57) ABSTRACT

An object is to provide a highly reliable light emitting device which is thin and is not damaged by external local pressure. Further, another object is to manufacture a light emitting device with a high yield by preventing defects of a shape and characteristics due to external stress in a manufacture process. A light emitting element is sealed between a first structure body in which a fibrous body is impregnated with an organic resin and a second structure body in which a fibrous body is impregnated with an organic resin, whereby a highly reliable light emitting device which is thin and has
(Continued)

intensity can be provided. Further, a light emitting device can be manufactured with a high yield by preventing defects of a shape and characteristics in a manufacture process.

12 Claims, 20 Drawing Sheets

Related U.S. Application Data continuation of application No. 14/511,742, filed on Oct. 10, 2014, now Pat. No. 10,079,330, which is a continuation of application No. 13/604,028, filed on Sep. 5, 2012, now Pat. No. 8,860,306, which is a continuation of application No. 12/500,247, filed on Jul. 9, 2009, now Pat. No. 8,264,144.

(51) Int. Cl.
  *H01L 51/52* (2006.01)
  *H01L 51/56* (2006.01)
(52) U.S. Cl.
  CPC ...... *H01L 51/5237* (2013.01); *H01L 51/5253* (2013.01); *H01L 51/56* (2013.01); *H01L 2227/323* (2013.01); *H01L 2227/326* (2013.01)

(56) References Cited

U.S. PATENT DOCUMENTS

| | | | |
|---|---|---|---|
| 5,075,166 A | 12/1991 | Sikorski et al. |
| 5,597,631 A | 1/1997 | Furumoto et al. |
| 5,757,456 A | 5/1998 | Yamazaki et al. |
| 5,770,313 A | 6/1998 | Furumoto et al. |
| 5,821,138 A | 10/1998 | Yamazaki et al. |
| 5,879,502 A | 3/1999 | Gustafson |
| 6,015,724 A | 1/2000 | Yamazaki |
| 6,118,502 A | 9/2000 | Yamazaki et al. |
| 6,224,965 B1 | 5/2001 | Haas et al. |
| 6,376,333 B1 | 4/2002 | Yamazaki et al. |
| 6,403,221 B1 | 6/2002 | Nakamura et al. |
| 6,482,495 B1 | 11/2002 | Kohama et al. |
| 6,491,228 B1 | 12/2002 | Ueda et al. |
| 6,608,449 B2 | 8/2003 | Fukunaga |
| 6,762,508 B1 | 7/2004 | Kiso et al. |
| 6,809,482 B2 | 10/2004 | Koyama |
| 6,849,877 B2 | 2/2005 | Yamazaki et al. |
| 6,933,533 B2 | 8/2005 | Yamazaki et al. |
| 6,953,951 B2 | 10/2005 | Yamazaki et al. |
| 6,992,439 B2 | 1/2006 | Yamazaki et al. |
| 6,998,282 B1 | 2/2006 | Yamazaki et al. |
| 7,049,178 B2 | 5/2006 | Kim et al. |
| 7,050,138 B1 | 5/2006 | Yamazaki et al. |
| 7,061,083 B1 | 6/2006 | Usami et al. |
| 7,105,422 B2 | 9/2006 | Utsunomiya |
| 7,116,044 B2 | 10/2006 | Fukunaga |
| 7,211,828 B2 | 5/2007 | Yamazaki et al. |
| 7,242,453 B2 | 7/2007 | Saida et al. |
| 7,253,087 B2 | 8/2007 | Utsunomiya |
| 7,301,171 B2 | 11/2007 | Osame et al. |
| 7,361,519 B2 | 4/2008 | Yamazaki et al. |
| 7,374,977 B2 | 5/2008 | Yamazaki et al. |
| 7,378,137 B2 | 5/2008 | Saida et al. |
| 7,414,361 B2 | 8/2008 | Nozawa |
| 7,420,208 B2 | 9/2008 | Yamazaki et al. |
| 7,436,112 B2 | 10/2008 | Furukawa |
| 7,459,352 B2 | 12/2008 | Yamazaki et al. |
| 7,485,489 B2 | 2/2009 | Bjorbell |
| 7,487,373 B2 | 2/2009 | Koyama |
| 7,538,017 B2 | 5/2009 | Kim et al. |
| 7,554,260 B2 | 6/2009 | Sakakura et al. |
| 7,601,236 B2 | 10/2009 | Yamashita et al. |
| 7,651,745 B2 | 1/2010 | Saida et al. |
| 7,662,011 B2 | 2/2010 | Yamazaki et al. |
| 7,667,310 B2 | 2/2010 | Dozen et al. |
| 7,667,393 B2 | 2/2010 | Fukunaga |
| 7,728,326 B2 | 6/2010 | Yamazaki et al. |
| 7,736,958 B2 | 6/2010 | Dozen et al. |
| 7,737,444 B2 | 6/2010 | Osame et al. |
| 7,759,788 B2 | 7/2010 | Aoki et al. |
| 7,785,933 B2 | 8/2010 | Dozen et al. |
| 7,808,098 B2 | 10/2010 | Sugiyama et al. |
| 7,816,682 B2 | 10/2010 | Kimura |
| 7,825,582 B2 | 11/2010 | Furukawa et al. |
| 7,869,119 B2 | 1/2011 | Oikawa et al. |
| 7,879,654 B2 | 2/2011 | Dozen et al. |
| 7,923,062 B2 | 4/2011 | Saida et al. |
| 7,935,969 B2 | 5/2011 | Yamashita et al. |
| 7,952,101 B2 | 5/2011 | Yamazaki et al. |
| 7,968,427 B2 | 6/2011 | Sugiyama et al. |
| 8,018,153 B2 | 9/2011 | Gotou |
| 8,098,006 B2 | 1/2012 | Ishizaki et al. |
| 8,134,149 B2 | 3/2012 | Yamazaki et al. |
| 8,138,502 B2 | 3/2012 | Nakamura et al. |
| 8,143,628 B2 | 3/2012 | Furukawa et al. |
| 8,143,708 B2 | 3/2012 | Oikawa et al. |
| 8,144,389 B2 | 3/2012 | Oikawa et al. |
| 8,164,256 B2 | 4/2012 | Sano et al. |
| 8,169,588 B2 | 5/2012 | Oikawa et al. |
| 8,264,144 B2 | 9/2012 | Oikawa et al. |
| 8,278,663 B2 | 10/2012 | Dozen et al. |
| 8,287,325 B2 | 10/2012 | Furukawa et al. |
| 8,300,031 B2 | 10/2012 | Kimura |
| 8,300,178 B2 | 10/2012 | Furukawa et al. |
| 8,338,865 B2 | 12/2012 | Kimura |
| 8,415,660 B2 | 4/2013 | Yamazaki et al. |
| 8,477,085 B2 | 7/2013 | Shishido |
| 8,497,512 B2 | 7/2013 | Nakamura et al. |
| 8,541,944 B2 | 9/2013 | Sano et al. |
| 8,581,491 B2 | 11/2013 | Yamashita et al. |
| 8,597,965 B2 | 12/2013 | Hatano et al. |
| 8,610,155 B2 | 12/2013 | Hatano et al. |
| 8,633,872 B2 | 1/2014 | Osame |
| 8,669,702 B2 | 3/2014 | Seo et al. |
| 8,822,982 B2 | 9/2014 | Yamazaki et al. |
| 8,841,671 B2 | 9/2014 | Kimura |
| 8,860,306 B2 | 10/2014 | Oikawa et al. |
| 8,872,182 B2 | 10/2014 | Kimura |
| 9,004,970 B2 | 4/2015 | Yamashita et al. |
| 9,268,188 B2 | 2/2016 | Kimura |
| 9,709,861 B2 | 7/2017 | Kimura |
| 10,001,678 B2 | 6/2018 | Kimura |
| 10,079,330 B2 | 9/2018 | Oikawa et al. |
| 10,509,271 B2 | 12/2019 | Kimura |
| 2003/0032210 A1 | 2/2003 | Takayama et al. |
| 2003/0071953 A1 | 4/2003 | Yamazaki et al. |
| 2003/0082889 A1 | 5/2003 | Maruyama et al. |
| 2004/0016939 A1 | 1/2004 | Akiba et al. |
| 2004/0229404 A1 | 11/2004 | Kiso et al. |
| 2005/0006647 A1 | 1/2005 | Utsunomiya |
| 2005/0070038 A1 | 3/2005 | Yamazaki et al. |
| 2005/0085034 A1 | 4/2005 | Akiba et al. |
| 2005/0162578 A1 | 7/2005 | Yamazaki et al. |
| 2005/0200301 A1 | 9/2005 | Yamazaki et al. |
| 2005/0231108 A1 | 10/2005 | Furukawa |
| 2005/0233122 A1 | 10/2005 | Nishimura et al. |
| 2005/0258441 A1 | 11/2005 | Shitagami |
| 2006/0011288 A1 | 1/2006 | Watanabe et al. |
| 2006/0110863 A1 | 5/2006 | Yamamoto et al. |
| 2006/0132461 A1 | 6/2006 | Furukawa et al. |
| 2007/0004125 A1 | 1/2007 | Watanabe et al. |
| 2007/0004202 A1 | 1/2007 | Fujii |
| 2007/0020932 A1 | 1/2007 | Maruyama et al. |
| 2007/0026580 A1 | 2/2007 | Fujii |
| 2007/0044303 A1 | 3/2007 | Yamano |
| 2007/0109465 A1 | 5/2007 | Jung et al. |
| 2007/0181875 A1 | 8/2007 | Yamazaki et al. |
| 2007/0212853 A1 | 9/2007 | Maruyama et al. |
| 2007/0259585 A1 | 11/2007 | Yamazaki et al. |
| 2007/0278563 A1 | 12/2007 | Takano et al. |
| 2008/0012126 A1 | 1/2008 | Dozen et al. |
| 2008/0044940 A1 | 2/2008 | Watanabe et al. |
| 2008/0093464 A1 | 4/2008 | Dairiki et al. |
| 2008/0213474 A1 | 9/2008 | Saida et al. |

(56) References Cited

U.S. PATENT DOCUMENTS

| | | |
|---|---|---|
| 2008/0224940 A1 | 9/2008 | Sugiyama et al. |
| 2008/0224941 A1 | 9/2008 | Sugiyama et al. |
| 2008/0225214 A1 | 9/2008 | Kinoshita et al. |
| 2008/0252531 A1 | 10/2008 | Hanaoka et al. |
| 2008/0280033 A1 | 11/2008 | Yamazaki et al. |
| 2008/0303140 A1 | 12/2008 | Ohtani et al. |
| 2008/0308810 A1 | 12/2008 | Akimoto |
| 2008/0309581 A1 | 12/2008 | Fujii et al. |
| 2009/0314527 A1 | 12/2009 | Hatano et al. |
| 2010/0007829 A1 | 1/2010 | Oikawa et al. |
| 2013/0228763 A1 | 9/2013 | Yamazaki et al. |
| 2014/0077199 A1 | 3/2014 | Yamazaki et al. |
| 2014/0326974 A1 | 11/2014 | Yamazaki et al. |
| 2014/0346488 A1 | 11/2014 | Yamazaki et al. |
| 2015/0187984 A1 | 7/2015 | Yamashita et al. |
| 2019/0033668 A1 | 1/2019 | Kimura |
| 2019/0235323 A1 | 8/2019 | Kimura |
| 2020/0117061 A1 | 4/2020 | Kimura |

FOREIGN PATENT DOCUMENTS

| | | |
|---|---|---|
| EP | 1 092 739 A1 | 4/2001 |
| EP | 1 589 797 A2 | 10/2005 |
| EP | 1 758 438 A2 | 2/2007 |
| EP | 1 777 689 A1 | 4/2007 |
| EP | 1 785 765 A1 | 5/2007 |
| EP | 1 970 951 A2 | 9/2008 |
| JP | 05-190582 A | 7/1993 |
| JP | 07-130472 A | 5/1995 |
| JP | 08-250745 A | 9/1996 |
| JP | 08-288522 A | 11/1996 |
| JP | 10-092980 A | 4/1998 |
| JP | 10-302027 A | 11/1998 |
| JP | 11-026911 A | 1/1999 |
| JP | 11-212116 A | 8/1999 |
| JP | 2000-231619 A | 8/2000 |
| JP | 2001-237065 A | 8/2001 |
| JP | 2001-277726 A | 10/2001 |
| JP | 2001-356370 A | 12/2001 |
| JP | 2002-033198 A | 1/2002 |
| JP | 2002-324666 A | 11/2002 |
| JP | 2002-324904 A | 11/2002 |
| JP | 2002-352950 A | 12/2002 |
| JP | 2002-358031 A | 12/2002 |
| JP | 2003-086356 A | 3/2003 |
| JP | 2003-174153 A | 6/2003 |
| JP | 2003-187963 A | 7/2003 |
| JP | 2003-204049 A | 7/2003 |
| JP | 2004-118255 A | 4/2004 |
| JP | 2004-203015 A | 7/2004 |
| JP | 2004-362341 A | 12/2004 |
| JP | 2005-140818 A | 6/2005 |
| JP | 2005-140918 A | 6/2005 |
| JP | 2005-140976 A | 6/2005 |
| JP | 2005-142121 A | 6/2005 |
| JP | 2005-183374 A | 7/2005 |
| JP | 2005-259469 A | 9/2005 |
| JP | 2005-268024 A | 9/2005 |
| JP | 2005-285743 A | 10/2005 |
| JP | 2005-298703 A | 10/2005 |
| JP | 2005-301020 A | 10/2005 |
| JP | 2006-004907 A | 1/2006 |
| JP | 2006-048027 A | 2/2006 |
| JP | 2006-128679 A | 5/2006 |
| JP | 2006-133573 A | 5/2006 |
| JP | 2006-135299 A | 5/2006 |
| JP | 2006-139802 A | 6/2006 |
| JP | 2006-140513 A | 6/2006 |
| JP | 2006-179471 A | 7/2006 |
| JP | 2006-259049 A | 9/2006 |
| JP | 2006-323376 A | 11/2006 |
| JP | 2007-012815 A | 1/2007 |
| JP | 2007-067381 A | 3/2007 |
| JP | 2007-140490 A | 6/2007 |
| JP | 2007-140513 A | 6/2007 |
| JP | 2007-241999 A | 9/2007 |
| JP | 2007-287503 A | 11/2007 |
| JP | 2007-334317 A | 12/2007 |
| JP | 2008-033907 A | 2/2008 |
| JP | 2008-034142 A | 2/2008 |
| JP | 2008-059824 A | 3/2008 |
| JP | 2008-140684 A | 6/2008 |
| JP | 2008-141119 A | 6/2008 |
| JP | 2008-151963 A | 7/2008 |
| JP | 2008-159934 A | 7/2008 |
| JP | 2008-159935 A | 7/2008 |
| TW | 200426444 | 12/2004 |
| TW | 200427054 | 12/2004 |
| TW | 200711181 | 3/2007 |
| TW | 200822289 | 5/2008 |
| TW | I565354 | 1/2017 |
| WO | WO 1996/009158 A1 | 3/1996 |
| WO | WO 2001/001740 A1 | 1/2001 |
| WO | WO 2004/001848 A1 | 12/2003 |
| WO | WO 2005/052893 A1 | 6/2005 |
| WO | WO 2008/001703 A1 | 1/2008 |
| WO | WO 2008/032526 A1 | 3/2008 |
| WO | WO 2008/069286 A2 | 6/2008 |
| WO | WO 2010/005064 A1 | 1/2010 |

OTHER PUBLICATIONS

International Search Report re Application No. PCT/JP2009/062562, dated Aug. 11, 2009.
Written Opinion re Application No. PCT/JP2009/062562, dated Aug. 11, 2009.
Taiwanese Office Action re Application No. TW 098123072, dated Dec. 17, 2014.
Korean Office Action re Application No. KR 2015-7014585, dated Aug. 31, 2015.
Taiwanese Office Action re Application No. TW 104120727, dated Apr. 18, 2016.
Korean Office Action re Application No. KR 2015-7014585, dated Sep. 30, 2016.
Taiwanese Office Action re Application No. TW 105131694, dated Oct. 27, 2017.
Taiwanese Office Action re Application No. TW 105131694, dated Feb. 7, 2018.
Taiwanese Office Action re Application No. TW 107130866, dated Sep. 28, 2018.

\* cited by examiner

FIG. 16-A1
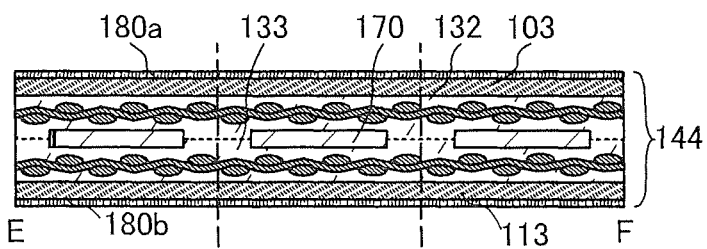
FIG. 16-A2
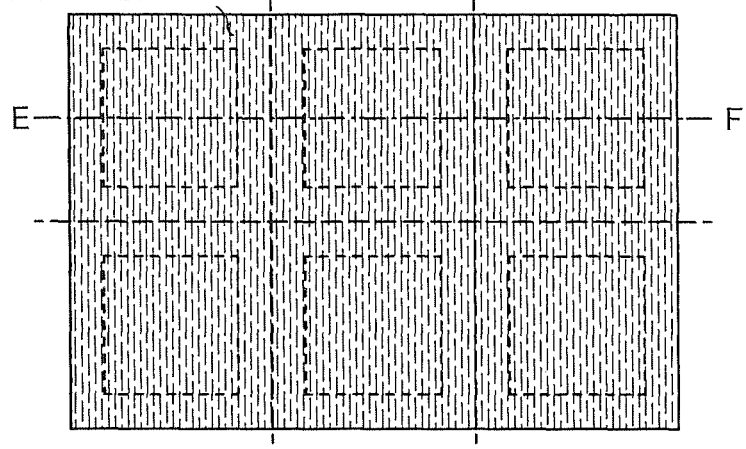
FIG. 16-B1
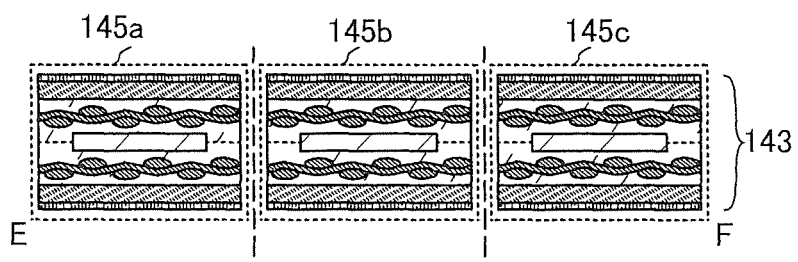
FIG. 16-B2
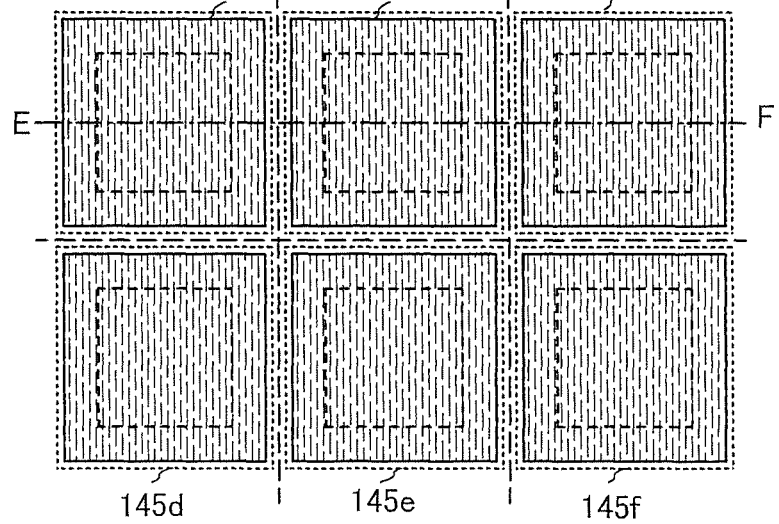

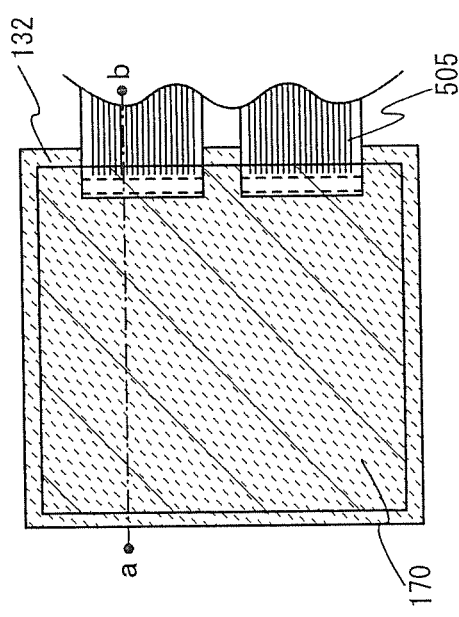
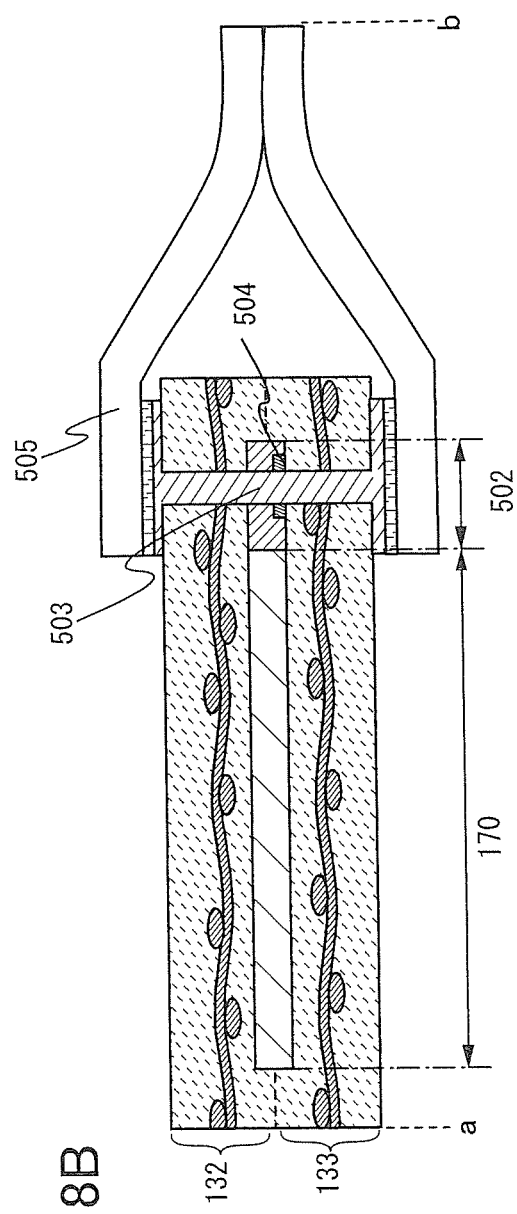
FIG. 18A
FIG. 18B

LIGHT EMITTING DEVICE SEALED IN A FIBROUS BODY TO IMPROVE MANUFACTURABILITY AND ELECTRONIC DEVICE INCLUDING THE LIGHT EMITTING DEVICE

This application is a continuation of copending application Ser. No. 16/120,851 filed on Sep. 4, 2018 which is a continuation of application Ser. No. 14/511,742 filed on Oct. 10, 2014 (now U.S. Pat. No. 10,079,330 issued Sep. 18, 2018) which is a continuation of application Ser. No. 13/604,028 filed on Sep. 5, 2012 (now U.S. Pat. No. 8,860,306 issued Oct. 14, 2014) which is a continuation of application Ser. No. 12/500,247 filed on Jul. 9, 2009 (now U.S. Pat. No. 8,264,144 issued Sep. 11, 2012), which are all incorporated herein by reference.

TECHNICAL FIELD

The present invention relates to a light emitting device having light emitting elements that employ electroluminescence. In addition, the present invention relates to an electronic device on which the light emitting device is mounted as a component.

BACKGROUND ART

In recent years, thin and flat display devices have been needed as display devices in a television, a cellular phone, a digital camera, and the like, and as the display devices satisfying this need, display devices using self-light emitting elements have attracted attention. One of the self-light emitting elements is a light emitting element utilizing electroluminescence (EL), and this light emitting element includes a light emitting material interposed between a pair of electrodes and can provide light emission from the light emitting material by voltage application.

Compared to a liquid crystal display, such a self-light emitting element has advantages such as the fact that its pixels have high visibility and the fact that it does not need a backlight. Such a self-light emitting element is considered to be suitable for application as a flat panel display element. In addition, such a self-light emitting element has a feature that the thickness can be reduced and that response speed is extremely fast.

In Reference 1, a flexible electroluminescence light emitting device using techniques of separation and transfer is proposed.

REFERENCE

Reference 1: Japanese Published Patent Application No. 2003-204049

DISCLOSURE OF INVENTION

As the market of the light emitting devices spreads, it is important to make devices into a thinner shape in miniaturizing products, and the thinning technique and the application range of the miniaturized products spread rapidly. However, when a light emitting device is thinned, a light emitting device, which is formed such that a layer including a semiconductor element is transferred to a plastic film or the like, is cracked by external local pressure, resulting in malfunctions.

Thus, an object of one embodiment of the present invention is to provide a highly reliable light emitting device which is thin and is not damaged by external local pressure. Further, another object is to manufacture a light emitting device with a high yield by preventing a defect in shape and characteristic due to external stress in a manufacturing process.

A light emitting device according to one embodiment of the present invention includes a first structure body in which a fibrous body is impregnated with an organic resin and a second structure body in which a fibrous body is impregnated with an organic resin; and a light emitting element provided between the first structure body and the second structure body. The first structure body and the second structure body are in contact with each other and fixed to each other in an end portion to seal the light emitting element.

A light emitting device of one embodiment of the present invention includes a first structure body in which a fibrous body is impregnated with an organic resin and a second structure body in which a fibrous body is impregnated with an organic resin; a light emitting element provided between the first structure body and the second structure body; and impact relief layers provided on a surface of the first structure body on which the light emitting element is not provided and on a surface of the second structure body on which the light emitting element is not provided. The first structure body and the second structure body are in contact with each other and fixed to each other in an end portion to seal the light emitting element.

In the light emitting device of one embodiment of the present invention described above, an insulating layer may be provided between the light emitting element and the first structure body or the second structure body.

In the light emitting device of one embodiment of the present invention, a conductive layer may be provided on an outermost surface of the first structure body or the second structure body on which the light emitting element is not provided.

Note that in this specification, a light emitting element includes, in its scope, an element whose luminance is controlled by current or voltage, and specifically includes an inorganic electroluminescent (EL) element, an organic EL element, and the like.

The light emitting device of one embodiment of the present invention may be either a passive matrix light emitting device or an active matrix light emitting device. In the passive matrix light emitting device, a plurality of light emitting elements is connected to the same transistor. Meanwhile, in the active matrix light emitting device, light emitting elements are each connected to one of transistors.

In this specification, the thickness of the first structure body or the second structure body is defined by distance from the outermost surface of an element portion sandwiched between the first structure body and the second structure body, to the surface of the first structure body or the second structure body.

Note that the terms of degrees which are used in this specification, for example, "same" or "substantially the same" mean a reasonable amount of deviation from the modified term such that the end result is not significantly changed. These terms should be construed as including a deviation of at least ±5% of the modified term if this deviation would not negate the meaning of the word it modifies. Note that the ordinal numbers such as "first" and "second" in this specification are used for convenience and do not denote the order of steps and the stacking order of layers. In addition, the ordinal numbers in this specification do not denote particular names which specify the invention.

A light emitting element is sealed between the first structure body in which a fibrous body is impregnated with an organic resin and the second structure body in which a fibrous body is impregnated with an organic resin, whereby a highly reliable light emitting device which is thin and high-strength can be provided. Further, a light emitting device can be manufactured with a high yield by preventing defects of a shape and characteristics in a manufacture process.

BRIEF DESCRIPTION OF DRAWINGS

FIGS. 16A-1, 16A-2, 16B-1, and 16B-2 illustrate a method for manufacturing a light emitting device according to an embodiment of the present invention.

FIGS. 18A and 18B illustrate a light emitting device according to an embodiment of the present invention.

BEST MODE FOR CARRYING OUT THE INVENTION

Figure 1A:
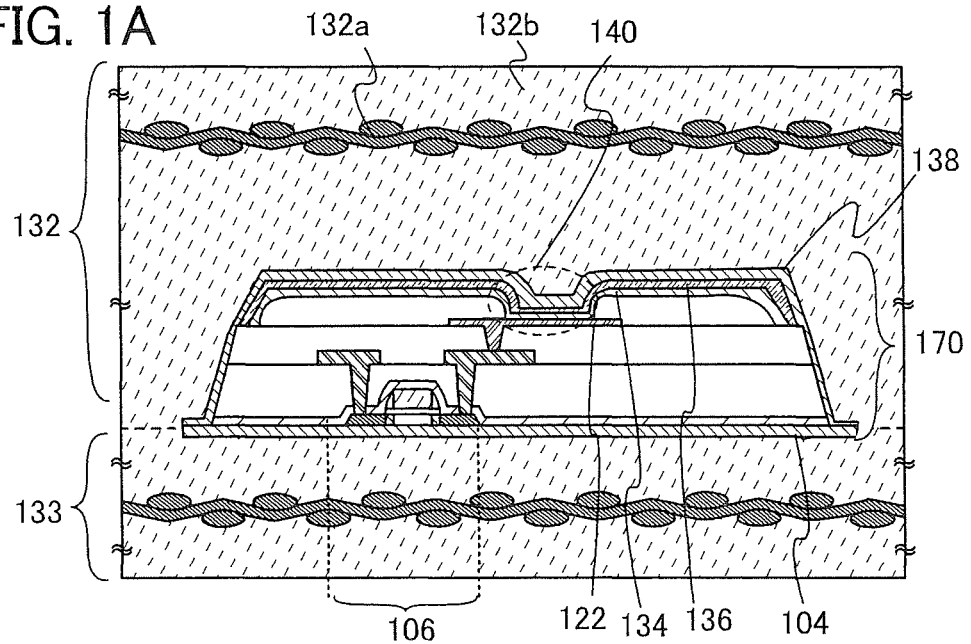
FIGS. 1A and 1B illustrate a light emitting device according to an embodiment of the present invention.

Embodiments of the present invention will be described in detail with reference to the accompanying drawings. Note that the present invention is not limited to the following description because it will be easily understood by those skilled in the art that various changes and modifications can be made without departing from the spirit and scope of the present invention. Therefore, the present invention should not be interpreted as being limited to what is described in the embodiments described below. In a structure to be given below, the same portions or portions having similar functions are denoted by the same reference numerals in different drawings, and description thereof will be omitted.

Embodiment 1

In this embodiment, an example of a light emitting device which is one embodiment of the present invention will be described in detail with reference to FIGS. 1A and 1B.

Figure 1B:
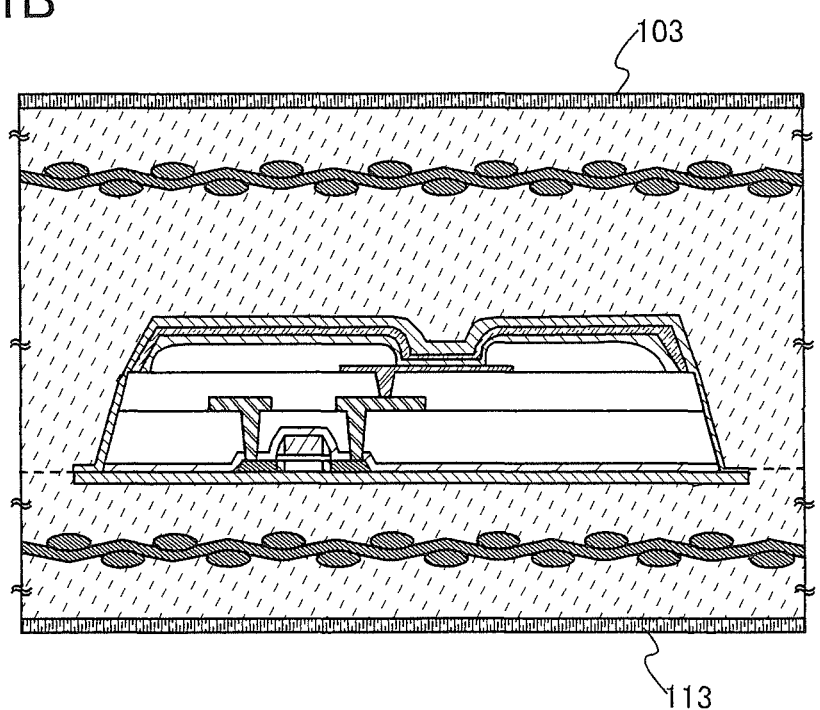

A display portion of a light emitting device of this embodiment is illustrated in FIGS. 1A and 1B. The light emitting device of this embodiment illustrated in FIG. 1A has an element portion 170 sealed between a first structure body 132 and a second structure body 133. In addition, an insulating layer 104 and an insulating layer 138 are formed between the element portion 170 and the second structure body 133 and between the element portion 170 and the first structure body 132. The first structure body 132 and the second structure body 133 are each a structure body in which a fibrous body 132a is impregnated with an organic resin 132b. In addition, the first structure body 132 and the second structure body 133 are in contact with each other and fixed to each other in a region where the element portion 170 is not provided (e.g., end portions of the first structure body 132 and the second structure body 133).

It is preferable for the first structure body 132 and the second structure body 133 to use a material in which the modulus of elasticity be higher than or equal to 13 GPa and the modulus of rupture be lower than 300 MPa. In addition, it is preferable for the first structure body 132 and the second structure body 133 to have a thickness of greater than or equal to 5 μm and less than or equal to 50 μm. Further, it is preferable that the first structure body 132 and the second structure body 133 have the same film thickness. When the first structure body 132 and the second structure body 133 have the same thickness, the element portion 170 can be placed in the central portion of the light emitting device.

In the first structure body 132 and the second structure body 133, the fibrous body 132a is woven using warp yarns spaced at regular intervals and weft yarns spaced at regular intervals. Such a fibrous body which is woven using the warp yarns and the weft yarns has regions without the warp yarns and the weft yarns. In the fibrous body 132a, the fibrous body 132a is more easily impregnated with the organic resin 132b, whereby adhesion between the fibrous body 132a and a light emitting element can be increased.

Further, in the fibrous body 132a, density of the warp yarns and the weft yarns may be high and a proportion of the regions without the warp yarns and the weft yarns may be low.

Further, in order to enhance permeability of an organic resin into the inside of the yarn bundle of fibers, the fiber may be subjected to surface treatment. For example, as the surface treatment, corona discharge, plasma discharge, and the like for activating a surface of the fiber can be given. Further, surface treatment using a silane coupling agent or a titanate coupling agent can be given.

Note that a structure body in which a fibrous body is impregnated with an organic resin may have a stacked structure. In that case, the structure body may be a stack of a plurality of structure bodies in each of which a single-layer fibrous body is impregnated with an organic resin or may be a structure body in which a plurality of fibrous bodies stacked is impregnated with an organic resin. In stacking a plurality of structure bodies in each of which a single-layer fibrous body is impregnated with an organic resin, another layer may be interposed between the structure bodies.

The element portion 170 sealed between the first structure body 132 and the second structure body 133 includes at least a light emitting element 140 and a switching element for applying potential to the light emitting element 140. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a thyristor, or the like can be used as the switching element. Alternatively, a logic circuit in which such elements are combined can be used as the switching element. In this embodiment, a thin film transistor 106 is used as the switching element. In addition, a driver circuit portion may be included in the element portion 170 using a light emitting device as a driver integrated type. Note that a driver circuit can be formed outside the element portion which is sealed.

The light emitting element 140 is formed such that a first electrode 122, an EL layer 134, and a second electrode 136 are stacked. One of the first electrode 122 and the second electrode 136 is used as an anode, and the other is used as a cathode.

The EL layer 134 included in the light emitting element includes at least a light emitting layer. In addition, the EL layer 134 can have a stacked structure including a hole injecting layer, a hole transporting layer, an electron transporting layer, an electron injecting layer, and/or the like, in addition to the light emitting layer. The EL layer 134 can be formed using either a low molecular material or a high molecular material. Note that the material forming the EL layer 134 is not limited to a material containing only an organic compound material, and may partially contain an inorganic compound material.

Note that materials exhibiting red (R), green (G), and blue (B) may be used when the light emitting device performs full color display to selectively form the EL layer 134. When performing monochrome display, a material exhibiting at least one color may be used to fain the EL layer 134. In addition, an EL layer and a color filter may be combined. Even in the case where a single color light emitting layer (for example, a white light emitting layer) is used, full-color display is possible by the color filter. For example, when an EL layer using a material from which white (W) light emission is obtained and a color filter are combined, full color display may be performed with four subpixels, that is, a pixel without a color filter and RGB pixels.

In the light emitting device illustrated in FIG. 1A, the element portion 170 is placed in a substantially central portion of a cross section of the light emitting device. In a region where the element portion 170 is not provided (e.g., end portions of the first structure body 132 and the second structure body 133), the first structure body 132 and the second structure body 133 are in contact with each other, so that the element portion 170 is sealed. The fibrous body 132a of the first structure body and the second structure body is formed from high-strength fiber, which has a high elongation modulus or a high Young's modulus. Accordingly, even when the local pressure such as point pressure or linear pressure is applied to the light emitting device, the high-strength fiber is not stretched. Pressing force is dispersed throughout the fibrous body 132a, and the whole light emitting device is curved. That is, a pair of structure bodies sandwiching the light emitting element functions as impact resistant layers against force applied to the light emitting device from the outside. As a result, even if local pressure is applied, the curve to be generated in the light emitting device has a large radius of curvature, whereby a light emitting element sealed between a pair of structure bodies, a wiring, and the like are not cracked and damage of the light emitting device can be reduced.

Further, when the element portion 170 is formed to have a small thickness, the light emitting device can be curved. Therefore, the light emitting device of this embodiment can be bonded to various base materials. When the light emitting device of this embodiment is attached to a base material having a curved surface, a display and a lighting device each having a curved surface can be realized. In addition, when the element portion 170 is thin, a light emitting device can be reduced in weight.

Another structure of a light emitting device of this embodiment which is different from the structure illustrated in FIG. 1A is illustrated in FIG. 1B. A light emitting device of this embodiment illustrated in FIG. 1B has a structure in which a first impact relief layer 103 and a second impact relief layer 113 are provided on the outer sides of the first structure body and the second structure body, respectively of the light emitting device of this embodiment illustrated in FIG. 1A (on sides opposing the light emitting element 140).

An impact relief layer has an effect of diffusing and reducing force to be applied to the light emitting device from the outside. Accordingly, as illustrated in FIG. 1B, by providing a structure body functioning as an impact resistant layer against force applied to the light emitting device from the outside (also referred to as external stress) and an impact relief layer that diffuses the force, locally applied force to the light emitting device can be further alleviated. Therefore, the strength of the light emitting device can be increased, and damage, defective characteristics, and the like of the light emitting device can be prevented.

It is preferable that the first impact relief layer 103 and the second impact relief layer 113 have a lower modulus of elasticity than the first structure body 132 and the second structure body 133 and have high breaking strength. For example, for the first impact relief layer 103 and the second impact relief layer 113, a film having rubber elasticity in which the modulus of elasticity is higher than or equal to 5 GPa and less than or equal to 12 GPa and the modulus of rupture is higher than or equal to 300 MPa can be used.

It is preferable that the first impact relief layer 103 and the second impact relief layer 113 be formed using a high-strength material. As typical examples of a high-strength material, a polyvinyl alcohol resin, a polyester resin, a polyamide resin, a polyethylene resin, an aramid resin, a polyparaphenylene benzobisoxazole resin, a glass resin, and the like can be given. By providing the first impact relief layer 103 and the second impact relief layer 113 formed using a high-strength material with elasticity, a load such as local pressure is diffused to and absorbed by the entire layer, so that the light emitting device can be prevented from being damaged.

In more specific, for the first impact relief layer 103 and the second impact relief layer 113, an aramid resin, a polyethylene naphthalate (PEN) resin, a polyethersulfone (PES) resin, a polyphenylene sulfide (PPS) resin, a polyimide resin (PI), a polyethylene terephthalate (PET) resin, or the like may be used. In this embodiment, an aramid film with the use of an aramid resin is used for the first impact relief layer 103 and the second impact relief layer 113.

A prepreg that is a structure body in which a fibrous body is impregnated with an organic resin is used for each of the first structure body 132 and the second structure body 133; therefore, bonding between the first structure body 132 and the first impact relief layer 103, bonding between the second structure body 133 and the second impact relief layer 113, and bonding between the first structure body 132 and the second structure body 133 can be performed by direct-heating and pressure treatment without a bonding layer interposed therebetween.

Note that as illustrated in FIG. 1B, when a pair of structure bodies and a pair of impact relief layers are symmetrically provided with respect to the element portion 170, force applied to the light emitting device can be distributed uniformly; therefore, damage of the element portion 170 due to bending, warpage, or the like can be prevented. Further, when a pair of structure bodies is formed using the same material to have the same thickness and a pair of impact relief layers is formed using the same material to have the same thickness, an equivalent characteristic can be provided, whereby the force becomes better distributed. Further, if the total thickness of the first structure body 132 and the first impact relief layer 103, or the total thickness of the second structure body 133 and the second impact relief layer 113 is larger than the total thickness of the element portion 170, the first structure body 132, the first impact relief layer 103, the second structure body 133, and the second impact relief layer 113 relieve stress due to bending; therefore, the element portion 170 is less likely to be damaged, which is preferable.

Embodiment 2

In this embodiment, an example of a method for manufacturing a light emitting device illustrated in FIG. 1A will be described in detail with reference to FIGS. 2A to 2E, FIGS. 3A to 3C, and FIGS. 4A to 4C.

Figure 2A:
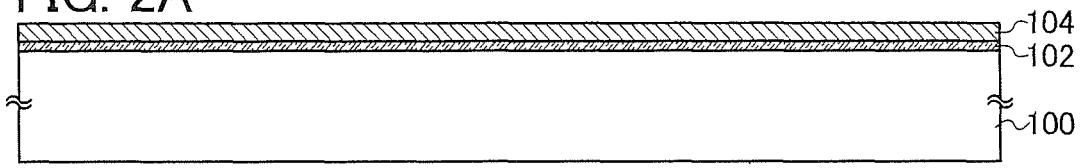
FIGS. 2A to 2E illustrate a method for manufacturing a light emitting device according to an embodiment of the present invention.

First, a separation layer 102 is formed on a surface of a substrate 100; successively, the insulating layer 104 is famed (see FIG. 2A). The separation layer 102 and the insulating layer 104 can be formed in succession. By forming successively, they are not exposed to the air so that impurities can be prevented from being contained therein.

For the substrate 100, a glass substrate, a quartz substrate, a metal substrate, a stainless steel substrate, or the like may be used. For example, when a rectangular glass substrate with a side of one meter or more is used, productivity can be drastically improved.

Note that in this process, the case where the separation layer 102 is provided on the entire surface of the substrate 100 is described; however, the separation layer 102 may be provided on the entire surface of the substrate 100, and then the separation layer 102 may be selectively removed, so that the separation layer may be provided only in a desired region, if needed. In addition, although the separation layer 102 is formed to be in contact with the substrate 100, an insulating layer such as a silicon oxide film, a silicon oxynitride film, a silicon nitride film, or a silicon nitride oxide film may be formed to be in contact with the substrate 100, if needed, and then the separation layer 102 may be formed to be in contact with the insulating layer.

The separation layer 102 is formed having a single-layer structure or a stacked structure of a layer with a thickness of 30 nm to 200 nm, which is formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of the above elements as its main component by a sputtering method, a plasma CVD method, a coating method, a printing method, or the like. The crystalline structure of a layer containing silicon may be any one of an amorphous state, a microcrystalline state, or a polycrystalline state. Here, a coating method is a method by which a film is formed by discharging a solution on an object to be processed and includes a spin coating method and a droplet discharging method. A droplet discharging method is a method for forming a predetermined pattern by discharging a droplet of a composition containing particulates from a small hole.

If the separation layer 102 has a single-layer structure, the separation layer 102 is preferably formed using a layer containing tungsten, molybdenum, or a mixture of tungsten and molybdenum. Alternatively, the separation layer 102 is formed using a layer containing oxide of tungsten, a layer containing oxynitride of tungsten, or a layer containing oxide or oxynitride of a mixture of tungsten and molybdenum. Note that the mixture of tungsten and molybdenum corresponds to an alloy of tungsten and molybdenum, for example.

When the separation layer 102 has a stacked structure, preferably, a metal layer is formed as a first layer, and a metal oxide layer is formed as a second layer. For example, as the first-metal layer, a layer containing tungsten or a layer containing a mixture of tungsten and molybdenum is formed. As the second layer, a layer containing oxide of tungsten, a layer containing oxide of a mixture of tungsten and molybdenum, a layer containing nitride of tungsten, a layer containing nitride of a mixture of tungsten and molybdenum, a layer containing oxynitride of tungsten, a layer containing oxynitride of a mixture of tungsten and molybdenum, a layer containing nitride oxide of tungsten, a layer containing nitride oxide of a mixture of tungsten and molybdenum is formed.

When the separation layer 102 has a stacked structure in which a metal layer is formed as the first layer and a metal oxide layer is formed as the second layer, the stacked structure may be formed by utilizing the following: a layer containing tungsten is formed as the metal layer, and an insulating layer made of oxide is formed thereover, whereby a layer containing oxide of tungsten is formed as the metal oxide layer at the interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizability such as ozone water, or the like.

The insulating layer 104 serves as a protective layer and is provided to facilitate separation at the interface between the separation layer 102 and the insulating layer 104 in a subsequent separation step or to prevent a semiconductor element and a wiring from being cracked or damaged in a subsequent separation step. For example, the insulating layer 104 is formed using an inorganic compound to be a single layer or a multilayer by a sputtering method, a plasma CVD method, a coating method, a printing method, or the like. As a typical example of an inorganic compound, silicon oxide, silicon nitride, silicon oxynitride, silicon nitride oxide, and the like can be given. When silicon nitride, silicon nitride oxide, silicon oxynitride, or the like is used for the insulating layer 104, entry of moisture or gas such as oxygen from outside into the element layer to be formed later can be prevented. The thickness of the insulating layer functioning as a protective layer is preferably greater than or equal to 10 nm and less than or equal to 1000 nm, more preferably, greater than or equal to 100 nm and less than or equal to 700 nm.

Figure 2B:
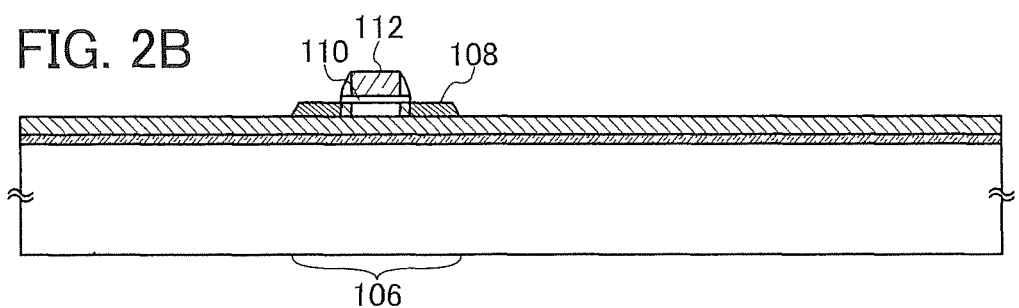

Next, the thin film transistor 106 is formed over the insulating layer 104 (see FIG. 2B). The thin film transistor 106 is formed using at least a semiconductor layer 108 having a source region, a drain region, and a channel formation region; a gate insulating layer 110; and a gate electrode 112.

The semiconductor layer 108 is a layer formed using a non-single-crystal semiconductor which has a thickness of greater than or equal to 10 nm and less than or equal to 100 nm, more preferably, greater than or equal to 20 nm and less than or equal to 70 nm. As a non-single-crystal semiconductor layer, a crystalline semiconductor layer, an amorphous semiconductor layer, a microcrystal semiconductor layer, and the like can be given. As the semiconductor, silicon, germanium, a silicon germanium compound, and the like can be given. In particular, it is preferable to apply a crystalline semiconductor which is formed by crystallization through laser irradiation, rapid thermal annealing (RTA), heat treatment using an annealing furnace, or a method in which any of these methods are combined. In the heat treatment, a crystallization method using a metal element such as nickel which can promote crystallization of silicon semiconductor can be used.

The gate insulating layer 110 is formed from an inorganic insulator such as silicon oxide and silicon oxynitride with a thickness of greater than or equal to 5 nm and less than or equal to 200 nm, preferably, greater than or equal to 10 nm and less than or equal to 100 nm.

The gate electrode 112 can be formed from a polycrystalline semiconductor to which metal or an impurity of one conductivity type is added. When using a metal, tungsten (W), molybdenum (Mo), titanium (Ti), tantalum (Ta), aluminum (Al) or the like can be used. Moreover, metal nitride obtained by nitriding metal can be used. Alternatively, a structure in which a first layer containing the metal nitride and a second layer containing the metal are stacked may be employed. By forming the first layer with metal nitride, the first layer can serve as metal barrier. In other words, the metal of the second layer can be prevented from diffusing into the gate insulating layer or into the semiconductor layer that is provided in the lower part of the gate insulating layer. In the case of employing a stacked structure, the gate electrode may have a shape in which the end portion of the first layer extends beyond the end portion of the second layer.

The thin film transistor 106 which is formed by combination of the semiconductor layer 108, the gate insulating layer 110, the gate electrode 112, and the like can employ various kinds of structures such as a single drain structure, an LDD (lightly doped drain) structure, and a gate overlap drain structure. Here, a thin film transistor having an LDD structure in which a low concentration impurity region is provided using an insulating layer (also referred to as a "sidewall") that is in contact with a side surface of the gate electrode 112 is illustrated. Moreover, a multi-gate structure where transistors, to which gate voltage having the same potential is equally applied, are serially connected; a dual-gate structure where the semiconductor layer is sandwiched by gate electrodes; or the like can be used.

As the thin film transistor, a thin film transistor using metal oxide or an organic semiconductor material for a semiconductor layer can be used. As typical examples of the metal oxide, zinc oxide, indium gallium zinc oxide, and the like can be given.

Figure 2C:
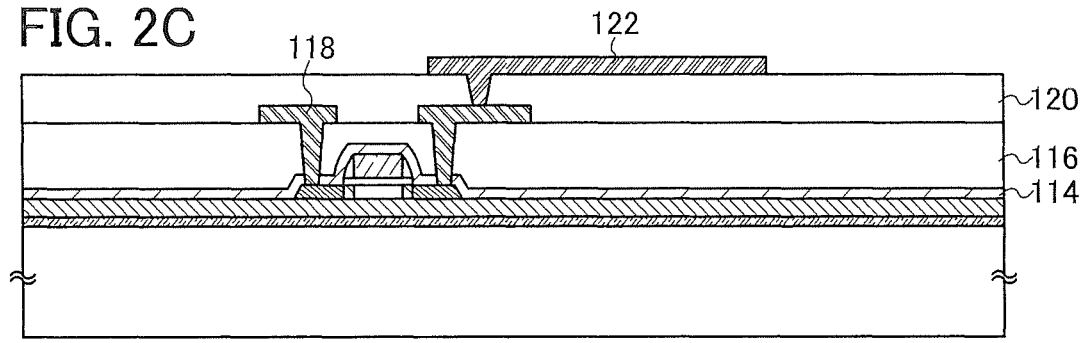

Next, a wiring 118 that is electrically connected to a source region and a drain region of the thin film transistor 106 is formed, and the first electrode 122 that is electrically connected to the wiring 118 is formed (see FIG. 2C).

Here, insulating layers 114 and 116 are formed to cover the thin film transistor 106, and the wiring 118 which can function as a source electrode and a drain electrode is formed over the insulating layer 116. Then, an insulating layer 120 is formed over the wiring 118, and the first electrode 122 is formed over the insulating layer 120.

The insulating layers 114 and 116 each serve as an interlayer insulating layer. The insulating layers 114 and 116 are formed to have a single layer or a stack of an inorganic material such as oxide of silicon or nitride of silicon; an organic material such as polyimide, polyamide, benzocyclobutene, acrylic, or epoxy; a siloxane material; or the like by a CVD method, a sputtering method, an SOG method, a droplet discharging method, a screen printing method, or the like. For example, a silicon nitride oxide film may be formed as the first insulating layer 114, and a silicon oxynitride film may be formed as the second insulating layer 116.

The wiring 118 is preferably formed of a combination of a low resistance material such as aluminum (Al) and a barrier metal using a high melting point metal material such as titanium (Ti) and molybdenum (Mo), for example, a stacked structure of titanium (Ti) and aluminum (Al) and a stacked structure of molybdenum (Mo) and aluminum (Al).

The insulating layer 120 is formed to have a single layer or a stack using an inorganic material such as oxide of silicon or nitride of silicon, an organic material such as polyimide, polyamide, benzocyclobutene, acrylic, or epoxy, a siloxane material, or the like by a CVD method, a sputtering method, a SOG method, a droplet discharging method, a screen printing method, or the like. Here, the insulating layer 120 is formed using epoxy by a screen printing method.

Note that the first electrode 122 is an electrode used as an anode or cathode of a light emitting element. In the case of being used as the anode, a material with a high work function is preferably used. For example, a single-layer film such as an indium tin oxide film, an indium tin oxide film containing silicon, a light-transmitting conductive film formed by a sputtering method using a target in which indium oxide is mixed with zinc oxide (ZnO) of 2 wt % to 20 wt %, a zinc oxide (ZnO) film, a titanium nitride film, a chromium film, a tungsten film, a Zn film, or a Pt film; a stack of a titanium nitride film and a film containing aluminum as its main component; a three-layer structure of a titanium nitride film, a film containing aluminum as its main component, and another titanium nitride film; or the like.

A material having a low work function (Al, Ag, Li, Ca, or an alloy thereof such as MgAg, MgIn, AlLi, $CaF_2$, or calcium nitride) is preferably used for a cathode. In the case where an electrode used as a cathode is made to transmit light, a stack of a metal thin film with a small thickness and a light-transmitting conductive film (an indium tin oxide film, an indium tin oxide film containing silicon, a light-transmitting conductive film formed by a sputtering method using a target in which indium oxide is mixed with zinc oxide (ZnO) of 2 wt % to 20 wt %, a zinc oxide (ZnO) film, or the like) is preferably used as the electrode.

Next, an insulating layer 123 is formed to cover end portions of the first electrode 122. In this embodiment, the insulating layer 123 is formed using a positive photosensitive acrylic resin film. The insulating layer 123 is formed to have a curved surface with curvature at an upper end portion or a lower end portion thereof in order to make the coverage of the insulating layer 123 favorable. For example, in the case of using positive photosensitive acrylic as a material of the insulating layer 123, the insulating layer 123 is preferably formed to have a curved surface with a curvature radius (0.2 μm to 3 μm) only at an upper end portion. Either a negative type which becomes insoluble in an etchant by light irradiation or a positive type which becomes soluble in an etchant by light irradiation can be used as the insulating layer 123. Alternatively, the insulating layer 123 can be provided with a single-layer structure or a stacked structure of an organic material such as epoxy, polyimide, polyimide, polyvinylphenol, or benzocyclobutene, or a siloxane material such as a siloxane resin.

In addition, plasma treatment can be performed on the insulating layer 123 to oxidize or nitride the insulating layer 123; accordingly, a surface of the insulating layer 123 is modified and a dense film can be obtained. By modifying the surface of the insulating layer 123, intensity of the insulating layer 123 can be improved, and physical damage such as crack generation at the time of forming an opening or the like or film reduction at the time of etching can be reduced.

Figure 2D:
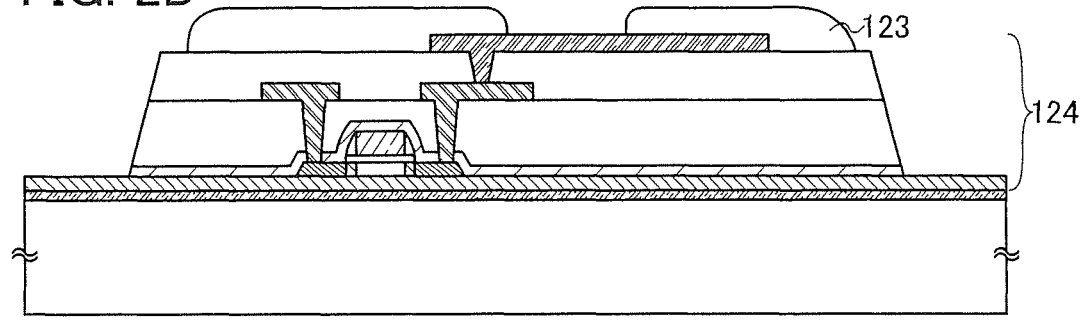
Figure 2E:
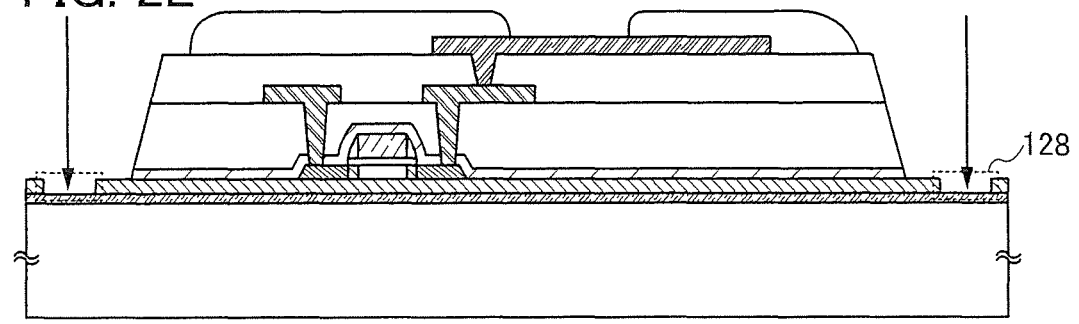

Next, an insulating layer provided on end portions of the substrate 100 is removed by etching or the like (see FIG. 2D). Here, at least the insulating layers 114, 116, and 120 are partly removed, and the insulating layer 104 is exposed. Note that in the case where a plurality of panels of light emitting devices is formed from one substrate (in the case of taking out many panels), an insulating layer is etched in end portions of each region where the panel is formed to be divided into elements that form the panels.

Next, an element formation layer 124 including the thin film transistors 106 and the like is separated from the substrate 100. It is preferable to form a groove by laser irradiation before the element formation layer 124 is separated from the substrate 100. Here, the insulating layer 104 exposed in the end portions is irradiated with a laser beam, whereby grooves 128 are formed (see FIG. 2E).

Figure 3A:
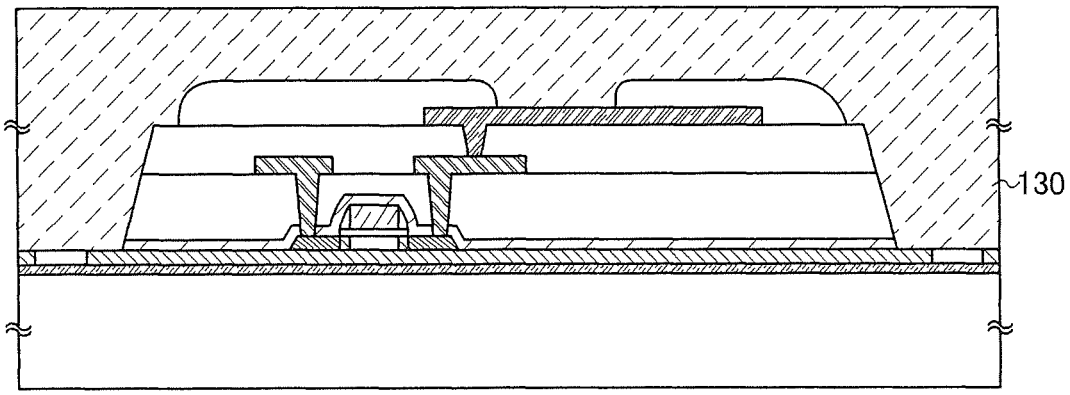
FIGS. 3A to 3C illustrate a method for manufacturing a light emitting device according to an embodiment of the present invention.

Next, as illustrated in FIG. 3A, an adhesive sheet 130 is attached to the element formation layer 124. For the adhesive sheet 130, a sheet which can be separated by light or heat is used.

The adhesive sheet 130 is attached, whereby stress that is, applied to the element formation layer 124 can be reduced before and after separation and damage of the thin film transistor 106 can be suppressed as well as separation can be easily performed.

Figure 3B:
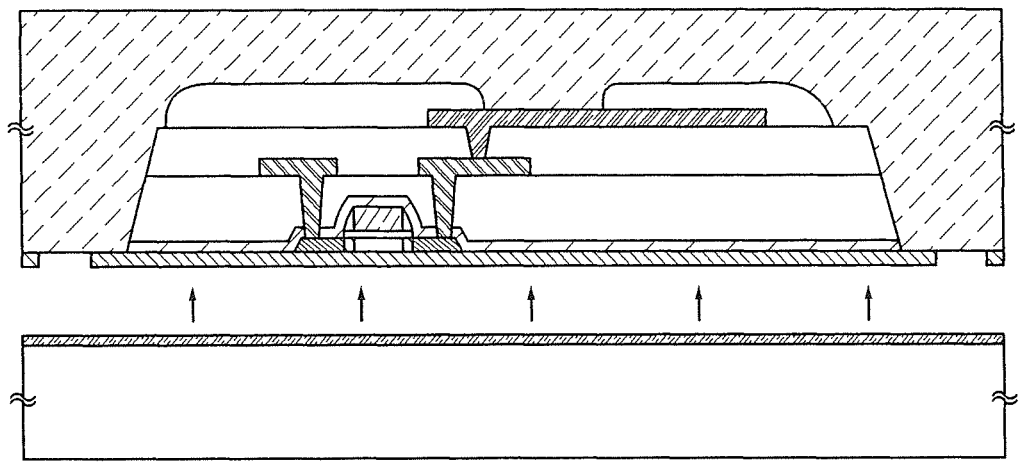

Next, the element formation layer 124 is separated from the substrate 100 at the interface between the separation layer 102 and the insulating layer 104 functioning as a protective layer, by using the grooves 128 as triggers (see FIG. 3B). For example, as a separation method, mechanical force (a separation process with a human hand or with a gripper, a separation process by rotation of a roller, or the like) may be used.

Further, a liquid may be dropped into the grooves 128 to allow the liquid to be infiltrated into the interface between the separation layer 102 and the insulating layer 104, which may be followed by the separation of the element formation layer 124 from the separation layer 102. Alternatively, a method can be employed in which a fluoride gas such as $NF_3$, $BrF_3$, or $ClF_3$ is introduced into the grooves 128, and the separation layer is removed by etching with the use of the fluoride gas so that the element formation layer 124 is separated from the substrate having an insulating surface.

In this embodiment, a method is employed in which a metal oxide layer is formed as the separation layer 102 in contact with the insulating layer 104, and the element formation layer 124 is separated by a physical means; however, this embodiment is not limited to the method. For example, the following method can be employed: a light-transmitting substrate is used as the substrate 100, an amorphous silicon layer containing hydrogen is used as the separation layer 102, the separation layer 102 is irradiated with a laser beam from the substrate 100, and hydrogen included in the amorphous silicon layer is vaporized so that separation is performed between the substrate 100 and the separation layer 102.

Alternatively, a method by which the substrate 100 is mechanically polished and removed, or a method by which the substrate 100 is dissolved and removed using a solution of HF or the like can be employed. In that case, the separation layer 102 is not required.

Figure 3C:
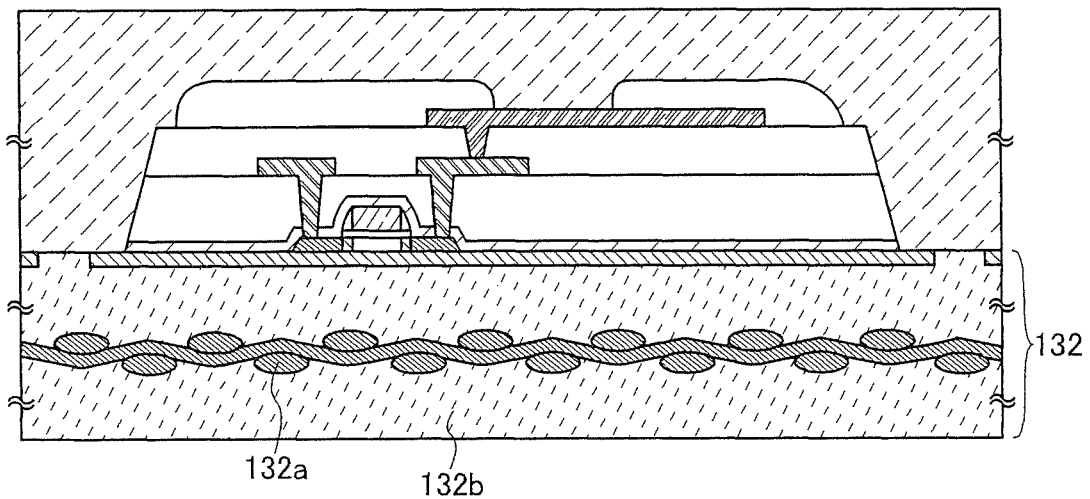

Next, on a separation surface (the surface of the insulating layer 104 exposed by separation) side of the element formation layer 124 separated, the first structure body 132 in which the fibrous body 132a is impregnated with the organic resin 132b is provided (see FIG. 3C). Such a structure body is also called a prepreg.

A prepreg is specifically formed in a following manner: after a fibrous body is impregnated with a varnish in which a matrix resin is diluted with an organic solvent, drying is performed so that the organic solvent is volatilized and the matrix resin is semi-cured. The thickness of the structure body is preferably greater than or equal to 10 μm and less than or equal to 100 μm, more preferably, greater than or equal to 10 μm and less than or equal to 30 μm. When a structure body with such a thickness is used, a thin light emitting device capable of being curved can be manufactured.

A thermosetting resin such as an epoxy resin, an unsaturated polyester resin, a polyimide resin, a bismaleimide-triazine resin, or a cyanate resin can be used for the organic resin 132b. Alternatively, a thermoplastic resin such as a polyphenylene oxide resin, a polyetherimide resin, or a fluorine resin can be used. By using the above organic resin, the fibrous body can be fixed to the semiconductor integrated circuit by heat treatment. The higher the glass transition temperature of the organic resin 132b is, the less the organic resin 132b is destroyed by local pressing force, which is preferable.

Highly thermally-conductive filler may be dispersed in the organic resin 132b or the yarn bundle of the fibrous body 132a. As the highly thermally-conductive filler, aluminum nitride, boron nitride, silicon nitride, alumina, and the like can be given. As the highly thermally-conductive filler, a metal particle such as silver or copper can also be given. In the case where the highly thermally-conductive filler is included in the organic resin or the yarn bundles of fibers, heat can be easily released to the outside. Accordingly, thermal storage in the light emitting device can be suppressed and thus the light emitting device can be prevented from being damaged.

The fibrous body 132a is a woven or nonwoven fabric using high-strength fibers of an organic compound or an inorganic compound and a plurality of fibrous bodies is provided so as to partly overlap with each other. A high-strength fiber is specifically a fiber with a high tensile modulus of elasticity or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like can be given. As a glass fiber, a glass fiber using E glass, S glass, D glass, Q glass, or the like can be given. Note that the fibrous body 132a may be formed from one kind of the above-described high-strength fiber. Alternatively, the fibrous body 132a may be formed from plural kinds of the above-described high-strength fibers or may be formed from plural kinds of high-strength fibers. In addition, a fibrous body is not provided above and below the element portion 170 including a light emitting element but may be provided on one side of the element portion 170. Note that it is preferable to use a material having the same level or substantially the same level of refractive index for the fibrous body 132a and the organic resin 132b.

The fibrous body 132a may be a woven fabric which is woven using bundles of fibers (single yarns) (hereinafter, the bundles of fibers are referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in its cross section. Further, by using a loosely twisted yarn as the yarn bundle of fibers, the yarn bundle is easily flattened and has an elliptical shape or a flat shape in cross section. Using a yarn bundle having an elliptical shape or a flat shape in cross section in this manner can reduce the thickness of the fibrous body 132a. Accordingly, the thickness of the structure body can be reduced and thus a thin light emitting device can be manufactured.

Next, the first structure body 132 is heated and subjected to pressure bonding so that the organic resin 132b of the first structure body 132 is plasticized, semi-cured, or cured. In the case where the organic resin 132b is an organic plastic resin, the organic resin which is plasticized is then cured by cooling to room temperature. By heating and pressure bonding, the organic resin 132b is uniformly spread over the surface of the element formation layer 124 and cured. A step of pressure bonding of the first structure body 132 is performed under an atmospheric pressure or low pressure.

Figure 4A:
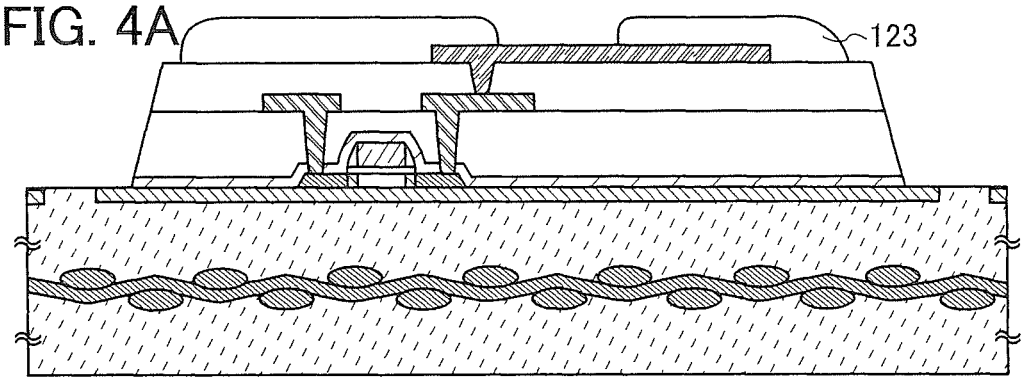
FIGS. 4A to 4C illustrate a method for manufacturing a light emitting device according to an embodiment of the present invention.
Figure 4B:
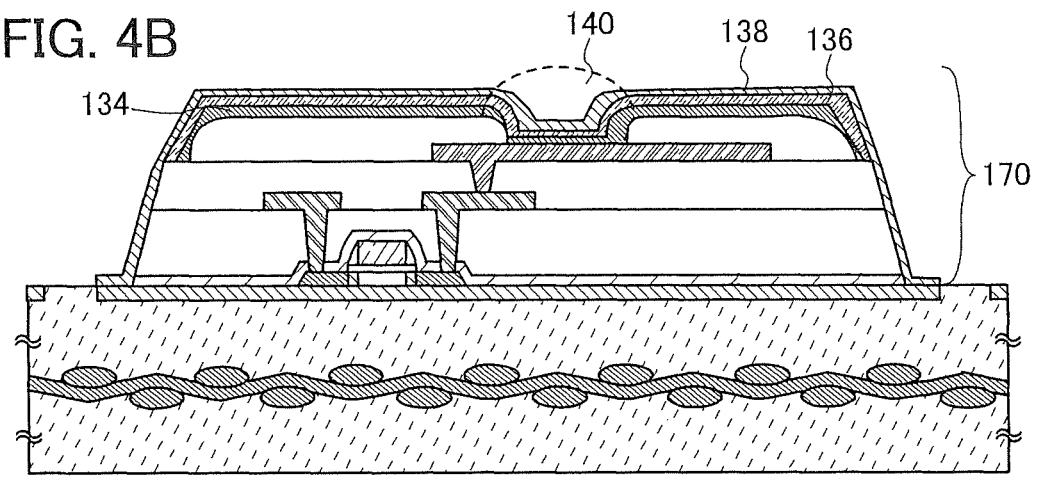
Figure 4C:
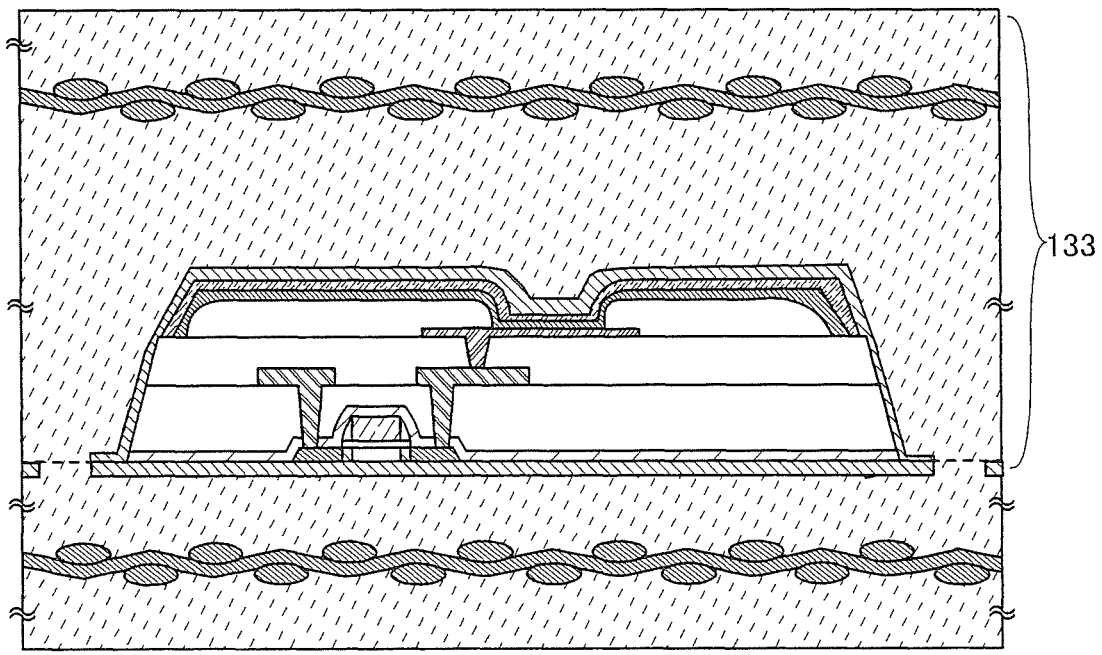

After pressure bonding of the first structure body 132, the adhesive sheet 130 is removed and the first electrode 122 is exposed (see FIG. 4A).

Next, the EL layer 134 is formed over the first electrode 122. The EL layer 134 can be formed using either a low molecular material or a high molecular material. Note that, a material forming the EL layer 134 is not limited to a material containing only an organic compound material, and it may partially contain an inorganic compound material.

Alternatively, the EL layer 134 may have at least a light emitting layer, and a single-layer structure that is formed using a single light emitting layer or a stacked structure including layers having different functions may be used. For example, functional layers such as a hole injecting layer, a hole transporting layer, a carrier-blocking layer, an electron transporting layer, electron injecting layer, and the like can be combined as appropriate in addition to a light emitting layer. Note that a layer having two or more functions of the respective functions of the layers may be included.

In addition, the EL layer 134 can be formed by either a wet process or a dry process, such as an evaporation method, an inkjet method, a spin coating method, a dip coating method, or a nozzle printing method.

Next, the second electrode 136 is formed over the EL layer 134. Accordingly, the light emitting element 140 in which the first electrode 122, the EL layer 134, and the second electrode 136 are stacked can be formed. Note that one of the first electrode 122 and the second electrode 136 is used as an anode, and the other is used as a cathode.

In the case of being used as the anode, a material with a high work function is preferably used. For example, a single-layer film such as an indium tin oxide film, an indium tin oxide film containing silicon, a light-transmitting conductive film formed by a sputtering method using a target in which indium oxide is mixed with zinc oxide (ZnO) of 2 wt % to 20 wt %, a zinc oxide (ZnO) film, a titanium nitride film, a chromium film, a tungsten film, a Zn film, or a Pt film; a stack of a titanium nitride film and a film containing aluminum as its main component; a three-layer structure of a titanium nitride film, a film containing aluminum as its main component, and another titanium nitride film; or the like.

A material having a low work function (Al, Ag, Li, Ca, or an alloy thereof such as MgAg, MgIn, AlLi, $CaF_2$, or calcium nitride) is preferably used for a cathode. In the case where an electrode used as a cathode is made to transmit light, a stack of a metal thin film with a small thickness and a light-transmitting conductive film (an indium tin oxide film, an indium tin oxide film containing silicon, a light-transmitting conductive film formed by a sputtering method using a target in which indium oxide is mixed with zinc oxide (ZnO) of 2 wt % to 20 wt %, a zinc oxide (ZnO) film, or the like) is preferably used as the electrode.

In this embodiment, the first electrode 122 is used as an anode, and the EL layer 134 has a structure in which a hole injecting layer, a hole transporting layer, a light emitting layer, an electron injecting layer are sequentially stacked from the first electrode 122 side. Various kinds of materials can be used for the light emitting layer. For example, a fluorescent compound which exhibits fluorescence or a phosphorescent compound which exhibits phosphorescence can be used.

Next, the insulating layer 138 is formed over the second electrode 136 so as to cover the light emitting element 140. Therefore, the element portion 170 can be formed. The insulating layer 138 functions as a protective layer and is provided as a heat insulating layer to prevent moisture or damage from entering the EL layer 134 in the later pressure bonding process of the second structure body or to reduce heating of the EL layer 134 in the later pressure bonding process of the second structure body. For example, the insulating layer 138 is formed using an inorganic compound to be a single layer or a multilayer by a sputtering method, a plasma CVD method, a coating method, a printing method, or the like. As a typical example of an inorganic compound, carbon, silicon oxide, silicon nitride, silicon oxynitride, silicon nitride oxide, and the like can be given. In addition, it is preferable that a film with favorable coverage be used for the insulating layer 138. Alternatively, a stacked-layer film of an organic compound and an inorganic compound may be used for the insulating layer 138. When silicon nitride, silicon nitride oxide, silicon oxynitride, or the like is used for the insulating layer 138, entry of moisture or gas such as oxygen from outside into the element layer to be formed later can be prevented. The thickness of the insulating layer functioning as a protective layer is preferably greater than or equal to 10 nm and less than or equal to 1000 nm, more preferably, greater than or equal to 100 nm and less than or equal to 700 nm (see FIG. 4B).

Next, the second structure body 133 is provided over the insulating layer 138. Similarly to the first structure body 132, a structure body in which a fibrous body is impregnated with an organic resin is used for the second structure body 133. Then, the second structure body 133 is heated and subjected to pressure bonding so that the second structure body 133 is bonded to the first structure body 132, and the element portion 170 including the light emitting element 140 is sealed by the first structure body 132 and the second structure body 133 (see FIG. 4C).

Through the above steps, a light emitting device of this embodiment having a light emitting element sealed by the first structure body and the second structure body can be formed.

As for the light emitting device of this embodiment, the element portion 170 is arranged in a substantially central portion in a cross section of the light emitting device, and the first structure body 132 and the second structure body 133 are in contact with each other and fixed to each other in the end portions where there is no element portion 170, so that the element portion 170 is sealed. In addition, the first structure body 132 and the second structure body 133 include a region where the first structure body 132 and the second structure body 133 adhere to each other so as to surround the periphery of the element portion 170. The first structure body 132 and the second structure body 133 are formed using the same material, whereby adhesion of the first structure body and the second structure body can be improved.

In the light emitting device of this embodiment, a pair of structure bodies which seals the element portion 170 can function as an impact resistant layer against force (also referred to as external stress) externally given to the light emitting device. By providing a pair of structure bodies on outer sides of the light emitting element, force locally applied to the light emitting element can be alleviated; therefore, damage, defective characteristics, and the like of the light emitting device due to external stress can be prevented. Accordingly, a highly reliable light emitting device that is reduced in thickness and size and has tolerance can be provided. Further, a light emitting device can be manufactured with a high yield by preventing defects of a shape and characteristics due to external stress in a manufacture process.

This embodiment can be freely combined with any of other embodiments.

Embodiment 3

In this embodiment, an example of a method for manufacturing a light emitting device different from that of the aforementioned embodiment will be described with reference to drawings. Note that in this embodiment, a manufacturing process of the light emitting device illustrated in FIG. 1A is described as an example.

Figure 5A:
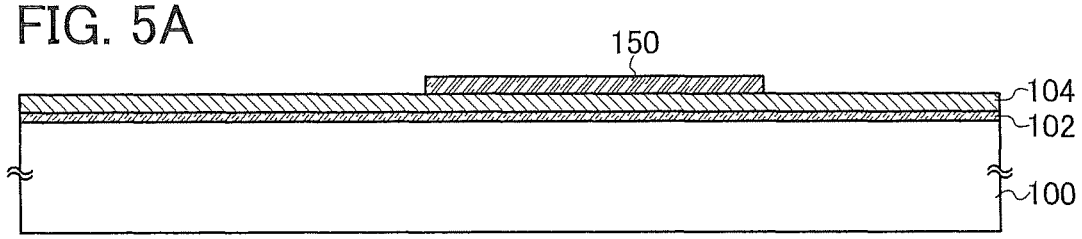
FIGS. 5A to 5D illustrate a method for manufacturing a light emitting device according to an embodiment of the present invention.

First, the separation layer 102 is formed over one surface of the substrate 100, and the insulating layer 104 is successively formed. Then, a first electrode 150 is formed over the insulating layer 104 (see FIG. 5A).

Note that the first electrode 150 is an electrode that is used as an anode or a cathode of a light emitting element In the case of being used as the anode, a material having a high work function is preferably used. For example, a single-layer film such as an indium tin oxide film, an indium tin oxide film containing silicon, a light-transmitting conductive film formed by a sputtering method using a target in which indium oxide is mixed with zinc oxide (ZnO) of 2 wt % to 20 wt %, a zinc oxide (ZnO) film, a titanium nitride film, a chromium film, a tungsten film, a Zn film, or a Pt film; a stack of a titanium nitride film and a film containing aluminum as its main component; a three-layer structure of a titanium nitride film, a film containing aluminum as its main component, and another titanium nitride film; or the like.

A material having a low work function (Al, Ag, Li, Ca, or an alloy thereof such as MgAg, MgIn, AlLi, $CaF_2$, or calcium nitride) is preferably used for a cathode. In the case where an electrode used as a cathode is made to transmit light, a stack of a metal thin film with a small thickness and a light-transmitting conductive film (an indium tin oxide film, an indium tin oxide film containing silicon, a light-transmitting conductive film formed by a sputtering method using a target in which indium oxide is mixed with zinc oxide (ZnO) of 2 wt % to 20 wt %, a zinc oxide (ZnO) film, or the like) is preferably used as the electrode.

Figure 5B:
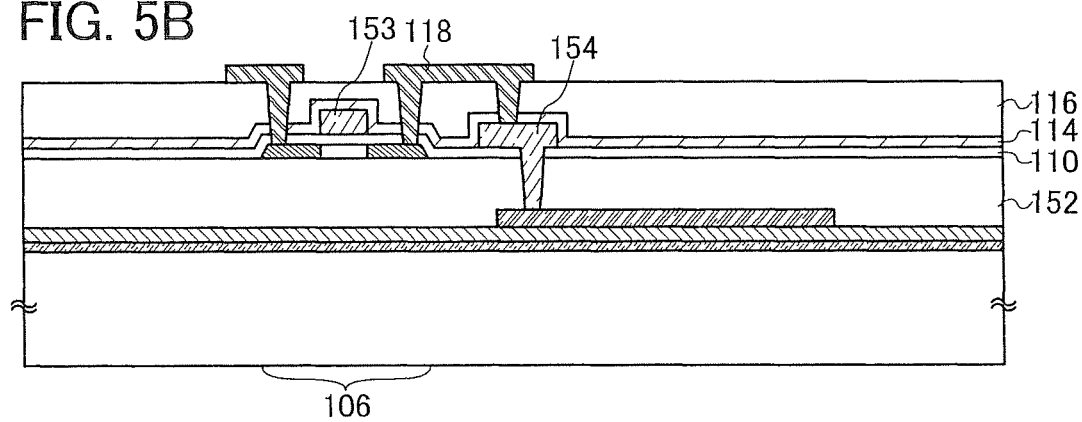

Next, an insulating layer 152 is formed over the first electrode 150, and the thin film transistor 106 is formed over the insulating layer 152. In addition, the insulating layers 114 and 116 are formed over the thin film transistor 106, and the wiring 118 which can function as a source electrode or a drain electrode is formed over the insulating layer 116 (see FIG. 5B).

For the thin film transistor 106, various structures such as a single-drain structure, an LDD (lightly doped drain) structure, and a gate overlap drain structure can be used. Here, a thin film transistor having a single-drain structure is described.

In addition, the wiring 118 and the first electrode 150 are electrically connected to each other. Here, the wiring 118 and the first electrode 150 are electrically connected to each other through a conductive layer 154. The conductive layer 154 can be formed at the same time as formation of a gate electrode 153 of the thin film transistor 106 (in the same process).

Figure 5C:
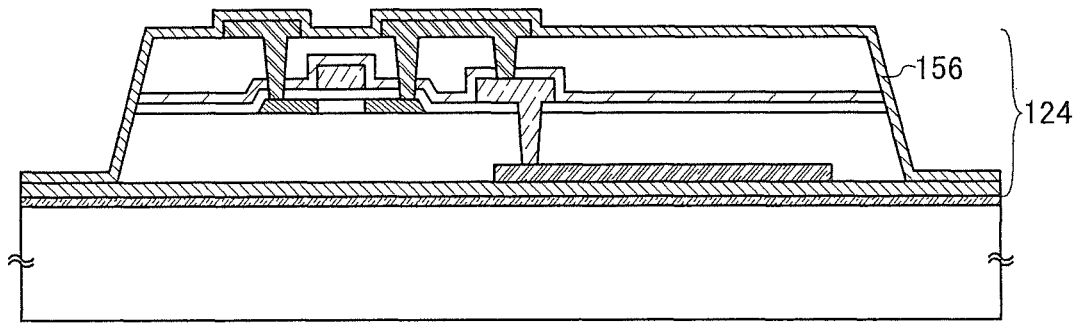

Next, the insulating layer provided on the end portions of the substrate 100 is removed by etching or the like, and then an insulating layer 156 is formed so as to cover the wiring 118 (see FIG. 5C). Here, the insulating layer 152 or the like is removed so as not to expose at least the insulating layer 104. Note that in the case where a plurality of panels of light emitting devices is formed from one substrate (in the case of taking out many panels), an insulating layer is etched in end portions of each region that forms the panel, and elements that form the panels are separated from each other.

Figure 5D:
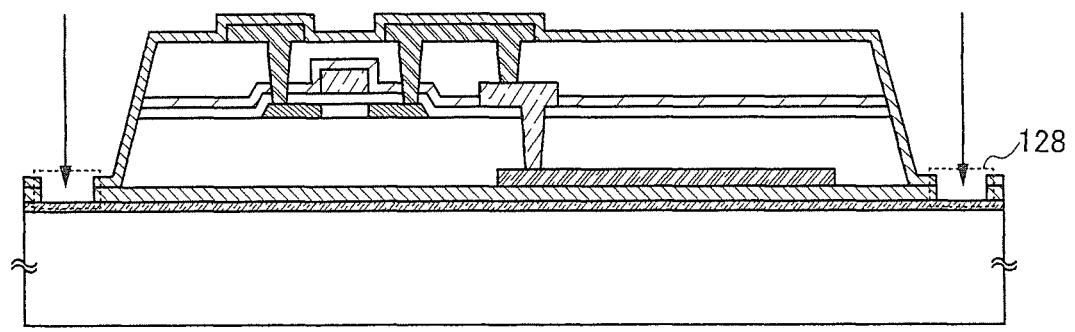

Next, the element formation layer 124 including the thin film transistor 106 and the like is separated from the substrate 100. It is preferable that, before the element formation layer 124 is separated from the substrate 100, laser irradiation be performed to form grooves. Here, the grooves 128 are formed by irradiating the insulating layers 156 and 104 with a laser beam in the end portions (see FIG. 5D).

Figure 6A:
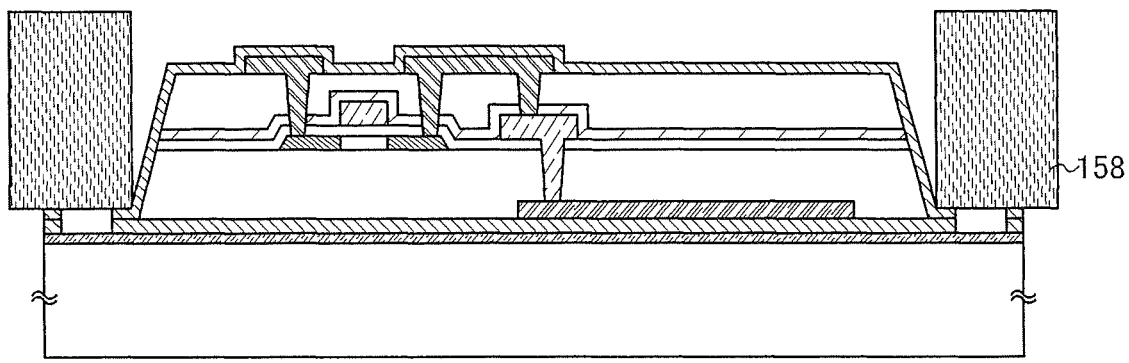
FIGS. 6A to 6C illustrate a method for manufacturing a light emitting device according to an embodiment of the present invention.

Next, a separate film 158 is provided so as to cover at least the grooves 128 (see FIG. 6A). There is a PET film provided with a silicone resin as an example of the separate film.

Figure 6B:
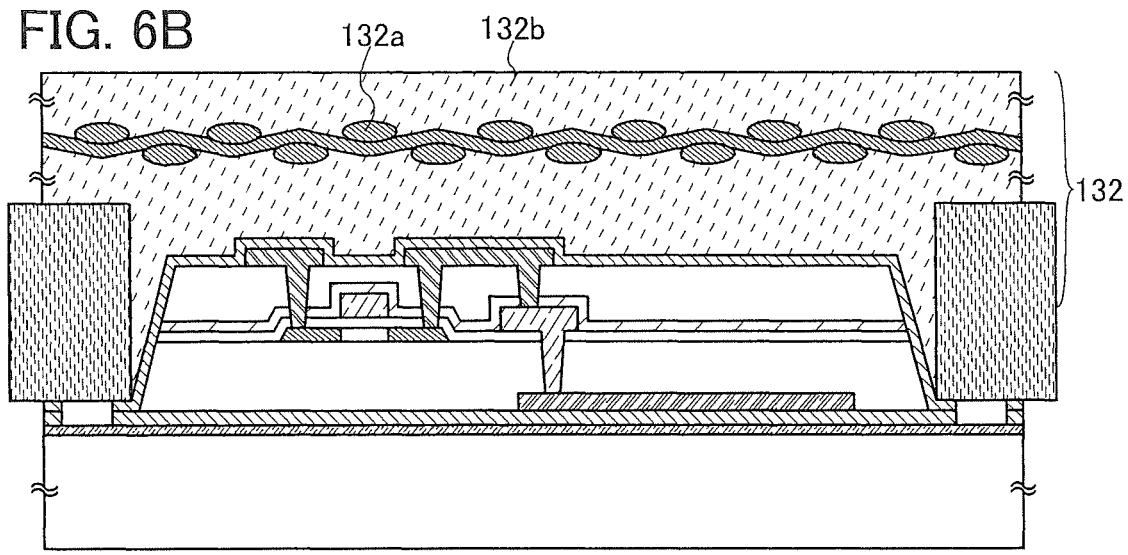

Next, the first structure body 132 in which the fibrous body 132*a* is impregnated with the organic resin 132*b* is provided on the surface of the insulating layer 156 (see FIG. 6B). Successively, the first structure body 132 is heated and subjected to pressure bonding, and the organic resin 132*b* of the first structure body 132 is plasticized, semi-cured, or cured.

The first structure body 132 is attached to the insulating layer 156, whereby separation can be performed easily, stress applied to the element formation layer 124 before and after separation can be reduced, and damage of the thin film transistor 106 can be suppressed.

The separate film 158 is provided before the first structure body 132 is attached, whereby separation failure due to the entry of the organic resin 132*b* into the grooves 128 and bonding to the separation layer 102 can be suppressed.

Figure 6C:
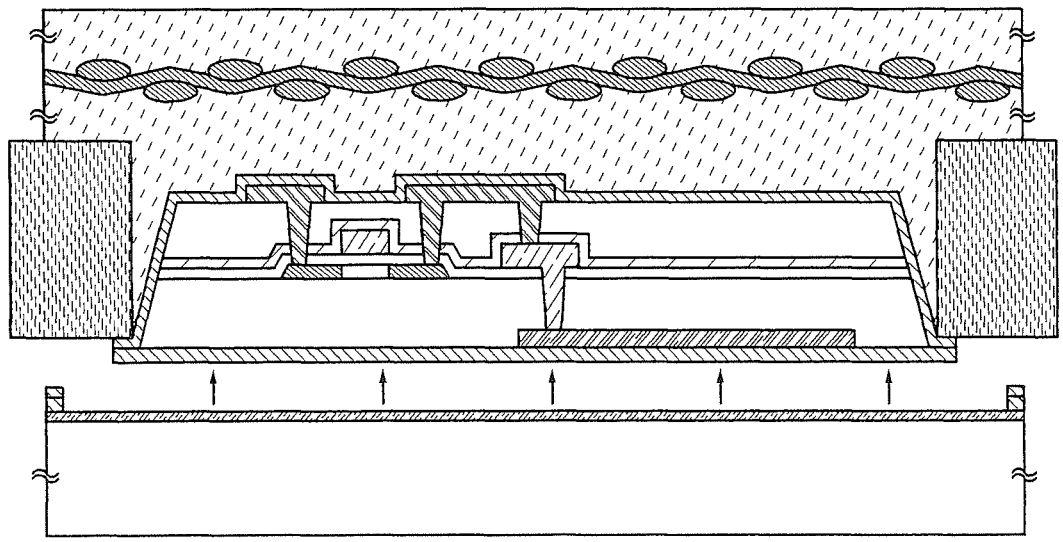

Next, the element formation layer 124 is separated from the substrate 100 at the interface between the separation layer 102 and the insulating layer 104 functioning as a protective layer, by using the grooves 128 as triggers (see FIG. 6C). In addition, it is preferable that the separate film 158 be removed after separation.

Figure 7A:
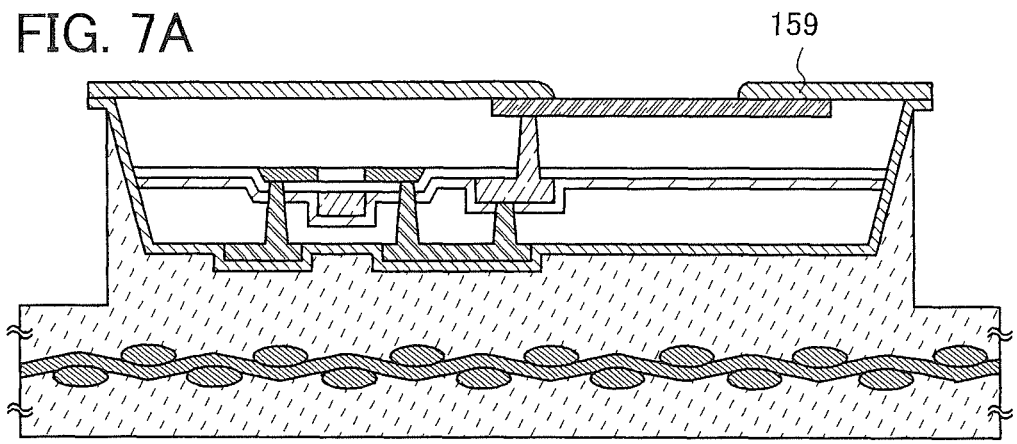
FIGS. 7A to 7C illustrate a method for manufacturing a light emitting device according to an embodiment of the present invention.

Next, an insulating layer 159 which is formed such a way that the insulating layer 104 is etched is formed so as to cover end portions of the first electrode 150 (see FIG. 7A). The insulating layer 159 functions as a bank (a partition) of the light emitting element. Since the first electrode is embedded in the insulating layer 152, the surface of the insulating layer 104 does not have a step due to unevenness of a wiring. Therefore, the insulating layer 159 functioning as a bank is formed using the insulating layer 104, whereby the thickness of the bank can be reduced, which is preferable. This leads to reduction in thickness of the light emitting device.

Note that the formation of the insulating layer 159 functioning as a bank of the light emitting element is not limited to the above method. For example, the insulating layer 104 may be removed by dry etching to expose the first electrode 150, and then an organic resin or the like may be used, whereby the insulating layer 159 may be formed so as to cover the end portions of the first electrode 150. Alternatively, an organic resin film may be formed over the insulating layer 104, the organic resin film and the insulating layer 104 may be etched by a photolithography process with the use of the same mask to expose the first electrode 150.

Next, an EL layer 160 is formed over the first electrode 150. The EL layer 160 can be formed using either a low molecular material or a high molecular material. Note that a material forming the EL layer 160 is not limited to a material containing only an organic compound material, and it may partially contain an inorganic compound material. Alternatively, the EL layer may have at least a light emitting layer, and a single-layer structure that is formed using a single light emitting layer or a stacked structure including layers having different functions may be used. Note that a layer having two or more functions of the respective functions of the layers may be included.

In addition, the EL layer 160 can be formed by either a wet process or a dry process, such as an evaporation method, an inkjet method, a spin coating method, a dip coating method, or a nozzle printing method.

Next, a second electrode 162 is formed over the EL layer 160. Therefore, a light emitting element 240 in which the first electrode 150, the EL layer 160, and the second electrode 162 are stacked can be formed. Note that one of the first electrode 150 and the second electrode 162 is used as an anode, and the other is used as a cathode.

Figure 7B:
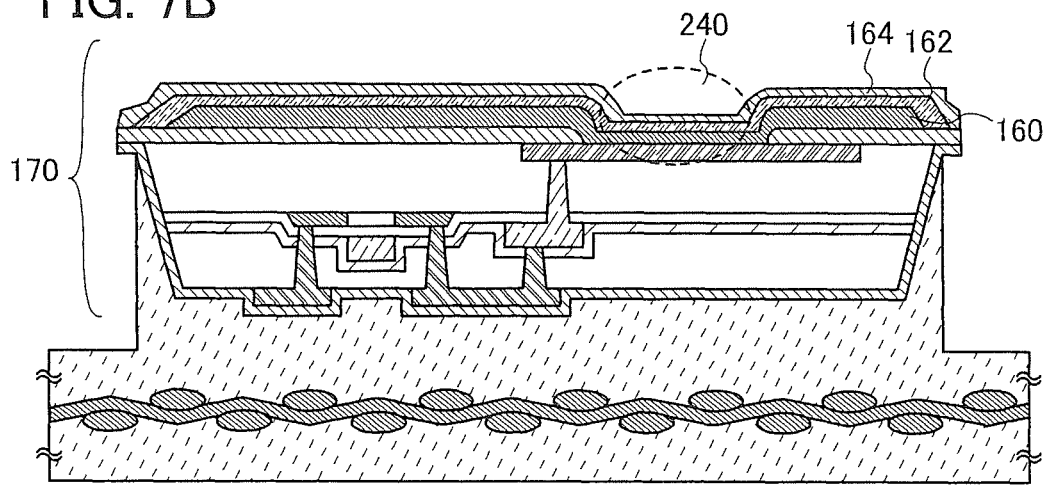

Next, an insulating layer 164 functioning as a protective layer is formed over the second electrode 162 so as to cover the light emitting element 240 (see FIG. 7B). Therefore, the element portion 170 can be formed.

Figure 7C:
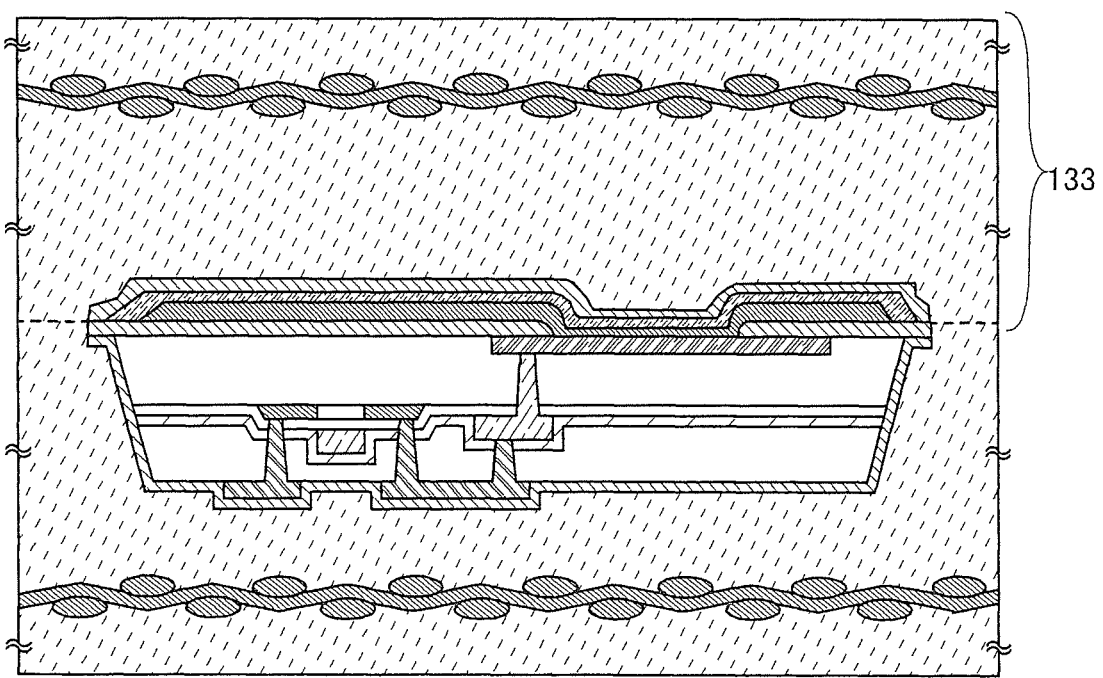

Next, the second structure body 133 is provided over the insulating layer 164. Similarly to the first structure body 132, a structure body in which a fibrous body is impregnated with an organic resin is used for the second structure body 133. Then, the second structure body 133 is heated and subjected to pressure bonding to be plasticized or cured, and the second structure body 133 is bonded to the first structure body 132 in end portions where there is no element portion 170. By this process, the element portion 170 including the light emitting element 240 can be sealed by the first structure body 132 and the second structure body 133 (see FIG. 7C). A step in which the structure body is subjected to pressure bonding is performed under an atmospheric pressure or a reduced pressure.

Through the above process, the light emitting device of this embodiment having the light emitting element sealed by the first structure body and the second structure body can be formed.

As for the light emitting device of this embodiment, the element portion 170 is arranged in a substantially central portion in a cross section of the light emitting device, and in the end portions where there is no element portion 170, the first structure body 132 and the second structure body 133 are in contact with each other and fixed to each other, so that the element portion 170 is sealed. In addition, the first structure body 132 and the second structure body 133 include a region where the first structure body 132 and the second structure body 133 adhere to each other so as to surround the periphery of the element portion 170. The first structure body 132 and the second structure body 133 are formed using the same material, whereby adhesion of the first structure body and the second structure body can be improved.

In the light emitting device of this embodiment, a pair of structure bodies which seals the element portion functions as impact resistant layers against force (also referred to as external stress) externally given to the light emitting device. By providing the structure bodies, force locally applied to the light emitting element can be alleviated; therefore, damage, defective characteristics, and the like of the light emitting device due to external stress can be prevented. Accordingly, a highly reliable light emitting device that is reduced in thickness and size and has tolerance can be provided. Further, a light emitting device can be manufactured with a high yield by preventing defects of a shape and characteristics due to external stress in a manufacture process.

This embodiment can be freely combined with any of other embodiments.

Embodiment 4

In this embodiment, a method for manufacturing a pixel portion of a light emitting device having a thin film transistor (a thin film transistor using an amorphous semiconductor film, a microcrystal semiconductor film, or the like; a thin film transistor using an organic semiconductor film; a thin film transistor using an oxide semiconductor; or the like) formed by a process at relatively low temperature (lower than 500° C.) will be described. Here, an EL display device is used as the light emitting device.

Figure 8A:
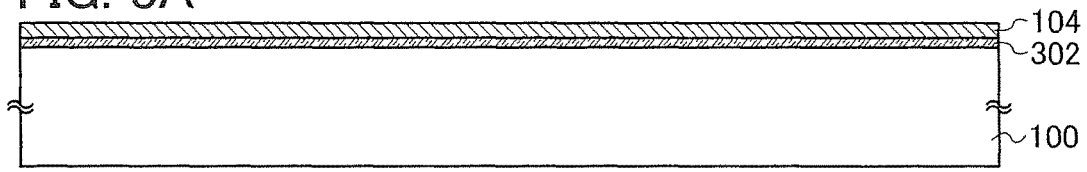
FIGS. 8A to 8E illustrate a method for manufacturing a light emitting device according to an embodiment of the present invention.

A separation layer 302 is formed on one surface of the substrate 100, and then the insulating layer 104 is formed (see FIG. 8A). The separation layer 302 and the insulating layer 104 can be formed in succession. By forming successively, they are not exposed to the air so that impurities can be prevented from being contained therein.

Note that in this process, the case where the separation layer 302 is provided on the entire surface of the substrate 100 is described; however, after the separation layer 302 may be provided on the entire surface of the substrate 100 if needed, the separation layer 302 may be removed selectively, whereby the separation layer may be provided only on a desired region. In addition, although the separation layer 302 is formed to be in contact with the substrate 100, an insulating layer such as a silicon oxide film, a silicon oxynitride film, a silicon nitride film, or a silicon nitride oxide film may be formed to be in contact with the substrate 100, if needed, and then the separation layer 302 may be formed to be in contact with the insulating layer.

The separation layer 302 is formed in such a manner that a layer having a thickness of 30 nm to 200 nm, which is made of molybdenum (Mo); an alloy material containing molybdenum as its main component; or a compound material containing a molybdenum element as its main component, is formed by a sputtering method, a plasma CVD method, a coating method, a printing method, or the like to be a single layer or a stack of a plurality of layers.

In the case where the separation layer 302 has a single-layer structure, a molybdenum layer or a layer containing a mixture of molybdenum is preferably formed. Alternatively, a layer containing oxide of molybdenum, a layer containing oxynitride of molybdenum, a layer containing oxide of a mixture of molybdenum, or a layer containing oxynitride of a mixture of molybdenum is formed. Note that the mixture of molybdenum is typically an alloy material containing molybdenum as its main component or a compound material containing a molybdenum element as its main component, and there is an alloy of tungsten and molybdenum as an example. However, an embodiment is not limited to this, and molybdenum may be contained.

When the separation layer 302 has a stacked structure, it is preferable to form a metal layer as a first layer and a metal oxide layer as a second layer. Typically, a layer containing molybdenum or a mixture of molybdenum is formed as the metal layer of the first layer; a layer containing oxide, nitride, oxynitride, or nitride oxide of molybdenum or a layer containing oxide, nitride, oxynitride, or nitride oxide of a mixture of molybdenum is formed as the second layer.

When the separation layer 302 has a stacked structure in which a metal layer is formed as the first layer and a metal oxide layer is formed as the second layer, the stacked structure may be formed as follows: a layer containing molybdenum is formed as the metal layer, and an insulating layer made of oxide is formed thereover, whereby a layer containing oxide of molybdenum is formed as the metal oxide layer at the interface between the layer containing molybdenum and the insulating layer. Moreover, the metal oxide layer may be formed in such a manner that the surface of the metal layer is subjected to thermal oxidation treatment, oxygen plasma treatment, treatment using a solution having strong oxidizability such as ozone water, or the like.

Note that the substrate 100 and the insulating layer 104 described in Embodiment 2 can be used as appropriate for the substrate 100 and the insulating layer 104.

Figure 8B:
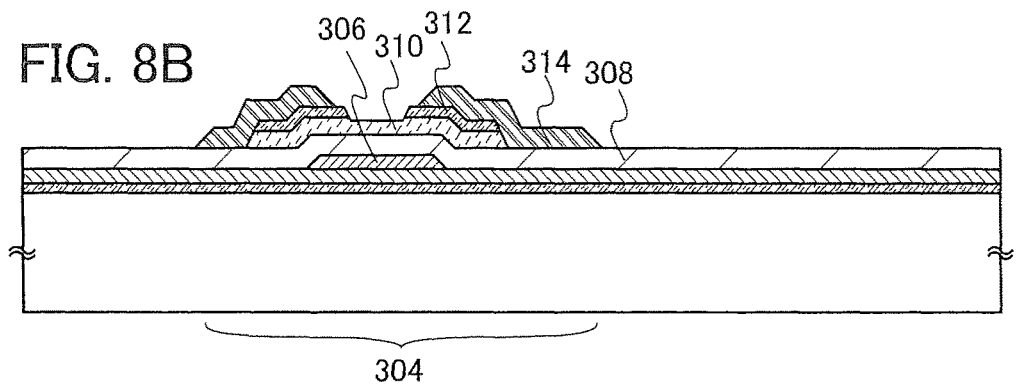

Next, a thin film transistor 304 is formed over the insulating layer 104 (see FIG. 8B). In this embodiment, an inverted staggered thin film transistor of which channel formation region is formed using an amorphous semiconductor, a microcrystal semiconductor, an organic semiconductor, or an oxide semiconductor is described as a thin film transistor.

The thin film transistor 304 is formed using at least a gate electrode 306, a gate insulating layer 308, and a semiconductor layer 310. In addition, an impurity semiconductor layer 312 functioning as a source region or a drain region may be formed over the semiconductor layer 310. Further, a wiring 314 that is in contact with the impurity semiconductor layer 312 is formed.

The gate electrode 306 can be formed to be a single layer or a stack using not only the metal used for the gate electrode 112 described in the above embodiment but also a metal material such as chromium, copper, neodymium, or scandium: or an alloy material containing any of these as its main component. Alternatively, a semiconductor layer typified by polycrystalline silicon doped with an impurity element such as phosphorus, or an AgPdCu alloy may be used. Alternatively, conductive oxide formed using indium, gallium, aluminum, zinc, tin, or the like or composite oxide may be used. For example, indium tin oxide (ITO) may be used for a gate electrode having a light-transmitting property.

The gate electrode 306 can be formed in such a way that a conductive layer is formed over the insulating layer 104, with the use of the material by a sputtering method or a vacuum evaporation method, a mask is formed by a photolithography method, an inkjet method, or the like over the conductive layer, and the conductive layer is etched using the mask.

Alternatively, the gate electrode 306 can be formed by discharging a conductive nanopaste of silver, gold, copper, or the like over the substrate by an inkjet method and baking the conductive nanopaste. Note that to improve adhesion between the gate electrode 306 and the insulating layer 104, a nitride layer of the metal material may be provided between the insulating layer 104 and the gate electrode 306. Here, a conductive layer is formed over the insulating layer 104 and etched by a resist mask formed using a photomask.

Note that a side surface of the gate electrode 306 preferably has a tapered shape. This is because disconnection at a step portion is prevented since a semiconductor layer and a wiring are formed over the gate electrode 306 in a later process. To form the side surface of the gate electrode 306 into a tapered shape, etching may be performed while the resist mask recedes. For example, an oxygen gas is included in an etching gas, whereby etching can be performed while the resist mask recedes.

In addition, a gate wiring (a scan line) can be formed by the process in which the gate electrode 306 is formed at the same time. Note that a "scan line" means a wiring arranged to select a pixel, while a "capacitor wiring" means a wiring which is connected to one electrode of a capacitor of a pixel. However, this embodiment is not limited to this, and one or both of the gate wiring and the capacitor wiring may be provided separately from the gate electrode 306.

The gate insulating layer 308 can be formed to be a single layer or a stack using silicon oxide, silicon nitride, silicon oxynitride, silicon nitride oxide, hafnium oxide, hafnium aluminum oxide, hafnium silicon oxynitride, or yttria by a CVD method, a sputtering method, a pulsed laser deposition method (PLD method), or the like. The gate insulating layer 308 can be formed using a CVD method, a sputtering method, or the like. In addition, the gate insulating layer 308 is formed using a microwave plasma CVD apparatus with high frequency (greater than or equal to 1 GHz), whereby withstand voltage between a gate electrode and a drain electrode or a source electrode can be improved; therefore, a highly reliable thin film transistor can be obtained.

The semiconductor layer 310 is a layer formed using a non-single-crystal semiconductor which has a thickness greater than or equal to 10 nm and less than or equal to 200 nm, more preferably, greater than or equal to 20 nm and less than or equal to 150 nm. As the semiconductor, silicon, germanium, a silicon germanium compound, and the like can be given. In this embodiment, without laser irradiation, heat treatment, and the like being performed, the semiconductor layer 310 is formed directly on the gate insulating layer 308 at a low temperature of less than 500° C. The separation layer 302 is formed using a layer containing at least molybdenum, whereby a separation process can be performed easily even when a thin film transistor is formed at a low temperature of less than 500° C.

Note that the semiconductor layer 310 may have a structure in which a microcrystal semiconductor and an amorphous semiconductor are stacked from a side which is in contact with the gate insulating layer. Alternatively, as the semiconductor layer 310, nitrogen or an NH group may be provided, and a non-single-crystal semiconductor which includes a crystal grain having an inverted conical shape and/or a micro-crystal grain having a grain size of greater than or equal to 1 nm and less than or equal to 10 nm, preferably, greater than or equal to 1 nm and less than or equal to 5 nm in an amorphous structure may be used.

Alternatively, as the semiconductor layer 310, an impurity element imparting one conductivity type such as phosphorus which imparts n-type conductivity may be added to an amorphous semiconductor or a microcrystal semiconductor. Further alternatively, as the semiconductor layer 310, a metal element which forms a silicide by reaction with silicon, such as titanium, zirconium, hafnium, vanadium, niobium, tantalum, chromium, molybdenum, tungsten, cobalt, nickel, platinum, or the like may be added to an amorphous semiconductor or a microcrystal semiconductor. Mobility of a semiconductor layer can be increased by adding an impurity element imparting one conductivity type, a metal element which forms a silicide by reaction with silicon, or the like; therefore, electron field-effect mobility of a thin film transistor in which the semiconductor layer serves as a channel formation region can be increased.

In addition, the semiconductor layer 310 can be formed using metal oxide or an organic semiconductor material. As typical examples of the metal oxide, zinc oxide, indium gallium zinc oxide, and the like can be given.

The impurity semiconductor layer 312 functioning as a source region and a drain region may be formed in contact with the semiconductor layer 310. The impurity semiconductor layer 312 may be formed using a semiconductor layer to which an impurity element imparting one conductivity type is added. When an n-channel thin film transistor is formed, phosphorus may be used as an impurity element imparting one conductivity type, and typically, amorphous silicon containing phosphorus or microcrystal silicon containing phosphorus is used. When a p-channel thin film transistor is formed, boron may be used as an impurity element imparting one conductivity type, and typically, amorphous silicon containing boron or microcrystal silicon containing boron is used.

The concentration of an impurity element imparting one conductivity type, here the concentration of phosphorus or boron is set to $1 \times 10^{19}$ to $1 \times 10^{21}$ cm$^{-3}$, the impurity semiconductor layer to which an impurity element imparting one conductivity type is added can have an ohmic contact with the wiring 314, and functions as the source region and the drain region.

The source and drain regions 312 are formed to have a thickness of greater than or equal to 10 nm and less than or equal to 100 nm, preferably, greater than or equal to 30 nm and less than or equal to 50 nm. When the source and drain regions 312 are thinned, throughput can be increased.

The wiring 314 can be formed in a manner similar to the manner in which the wiring 118 described in Embodiment 2 is formed. For example, conductive oxide or conductive composite oxide formed using indium, gallium, aluminum, zinc, tin, or the like may be used.

Figure 8C:
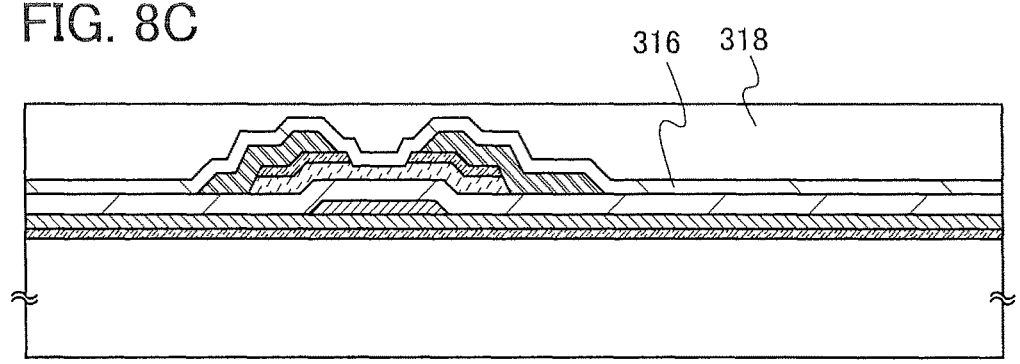

The thin film transistor of this embodiment can be applied to a switching transistor in a pixel of a light emitting device typified by an EL display device, in a manner similar to the manner in which the thin film transistors described in Embodiment 2 and Embodiment 3 are formed. Therefore, an insulating layer 316 and an insulating layer 318 which cover this thin film transistor are formed (see FIG. 8C).

Next, an opening 321 is formed so as to reach a source electrode and a drain electrode formed by the wiring 314. Note that when the opening 321 is formed, the insulating layer 316 and the insulating layer 318 which are provided in end portions of the substrate 100 are removed by etching or the like. Here, it is preferable that at least the insulating layer 318 be removed and the insulating layer 316 be exposed. Note that in the case where a plurality of EL panels is formed from one substrate (in the case of taking out many panels), it is preferable that at least the insulating layer 318 be etched in end portions of each region that forms the panel and elements that form the panels be separated from each other.

Figure 8D:
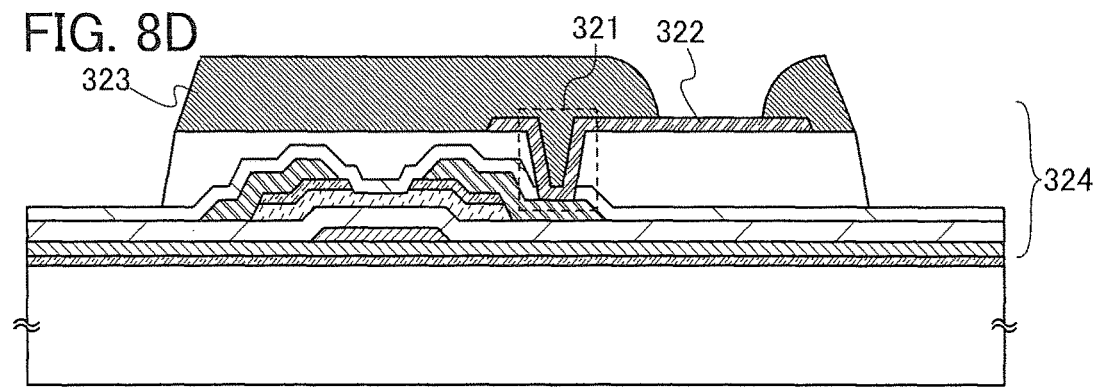

Next, a first electrode 322 is provided over the insulating layer 316 and the insulating layer 318 so as to be connected through the opening 321. Then, an insulating layer 323 is formed so as to cover an end portion of the first electrode 322, in a manner similar to the manner in which the insulating layer 123 of Embodiment 2 is formed. In such a manner, the switching thin film transistor in a pixel of the display device which is illustrated in FIG. 8D can be manufactured.

Note that the insulating layer 316 can be formed in a manner similar to the manner in which the gate insulating layer 308 is formed. Further, the insulating layer 316 is preferably a dense silicon nitride layer such that entry of a contaminant impurity element such as an organic substance, a metal substance, or moisture floating in the atmosphere can be prevented. The insulating layer 318 can be formed in a manner similar to the manner in which the insulating layer 116 described in Embodiment 2 is formed. In addition, the first electrode 322 can be formed in a manner similar to the manner in which the first electrode 122 described in Embodiment 2 is formed.

Figure 8E:
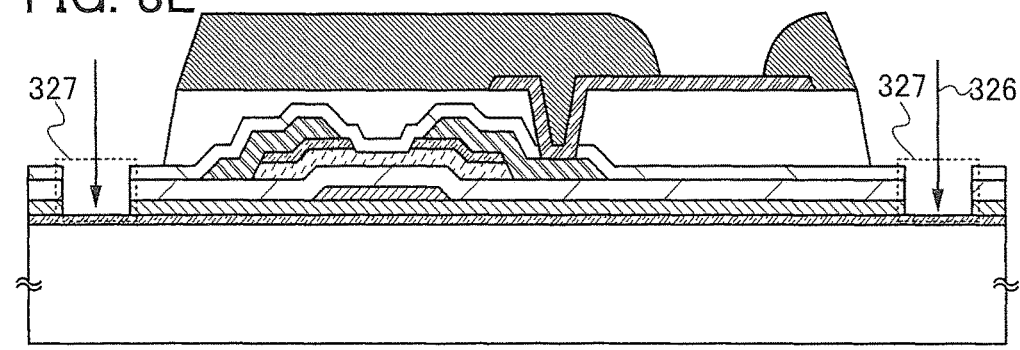

Next, an element formation layer 324 including the thin film transistor 304 and the like is separated from the substrate 100. Before the element formation layer 324 is separated from the substrate 100, it is preferable that laser irradiation be performed to form grooves 327. Here, the grooves 327 are formed by irradiating the insulating layer 316 exposed in end portions, the gate insulating layer 308, and the insulating layer 104, with a laser beam 326 (see FIG. 8E).

Figure 9A:
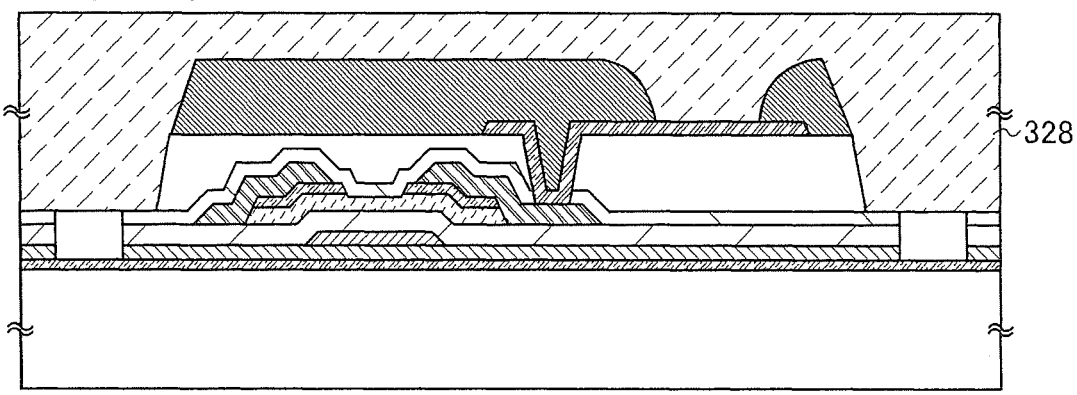
FIGS. 9A to 9C illustrate a method for manufacturing a light emitting device according to an embodiment of the present invention.

Next, as illustrated in FIG. 9A, an adhesive sheet 328 is attached to the element formation layer 324. For the adhesive sheet 328, a sheet which can be separated by light or heat is applied.

The adhesive sheet 328 is attached, whereby separation in the separation layer 302 can be performed easily, and stress to be applied to the element formation layer 324 before and after separation can be reduced and damage of the thin film transistor 304 can be suppressed.

Figure 9B:
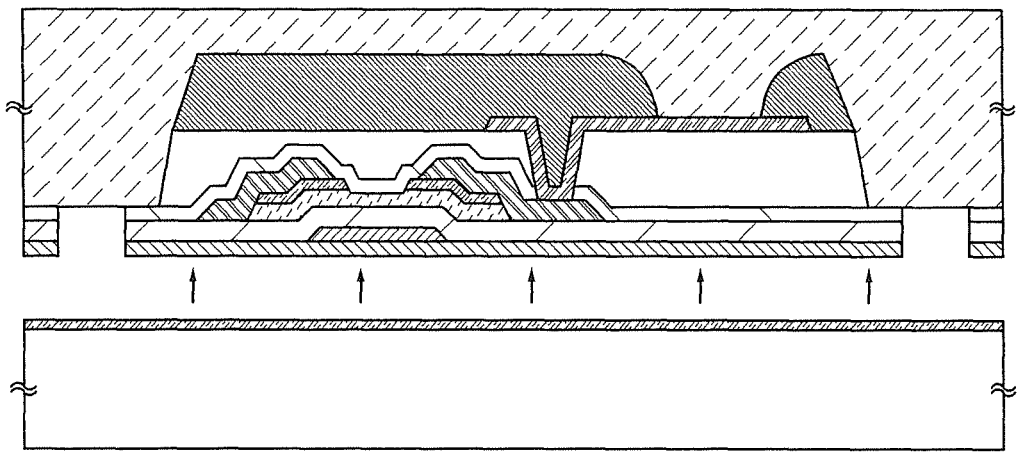

Next, the element formation layer 324 is separated from the substrate 100 at the interface between the separation layer 302 and the insulating layer 104 functioning as a protective layer, by using the grooves 327 as a trigger (see FIG. 9B). For example, as a separation method, mechanical force (a separation process with a human hand or with a gripper, a separation process by rotation of a roller, or the like) may be applied.

Further, a liquid may be dropped into the grooves 327 to allow the liquid to be infiltrated into the interface between the separation layer 302 and the insulating layer 104, which may be followed by the separation of the element formation layer 324 from the separation layer 302. Alternatively, a method can be employed in which a fluoride gas such as $NF_3$, $BrF_3$, or $ClF_3$ is introduced into the grooves 327, and the separation layer is removed by etching with the use of the fluoride gas so that the element formation layer 324 is separated from the substrate having an insulating surface.

In this embodiment, a method is employed in which a metal oxide layer is formed as the separation layer 302 in contact with the insulating layer 104, and the element formation layer 324 is separated by a physical means. However, this embodiment is not limited to this method, and the following method can be employed: a light-transmitting substrate is used as the substrate 100, an amorphous silicon layer containing hydrogen is used as the separation layer 302, the separation layer 302 is irradiated with a laser beam from the substrate 100, and hydrogen included in the amorphous silicon layer is vaporized so that separation is performed between the substrate 100 and the separation layer 302.

Alternatively, a method by which the substrate 100 is mechanically polished and removed, or a method by which the substrate 100 is dissolved and removed using a solution of HF or the like can be employed. In that case, the separation layer 302 is not required.

Figure 9C:
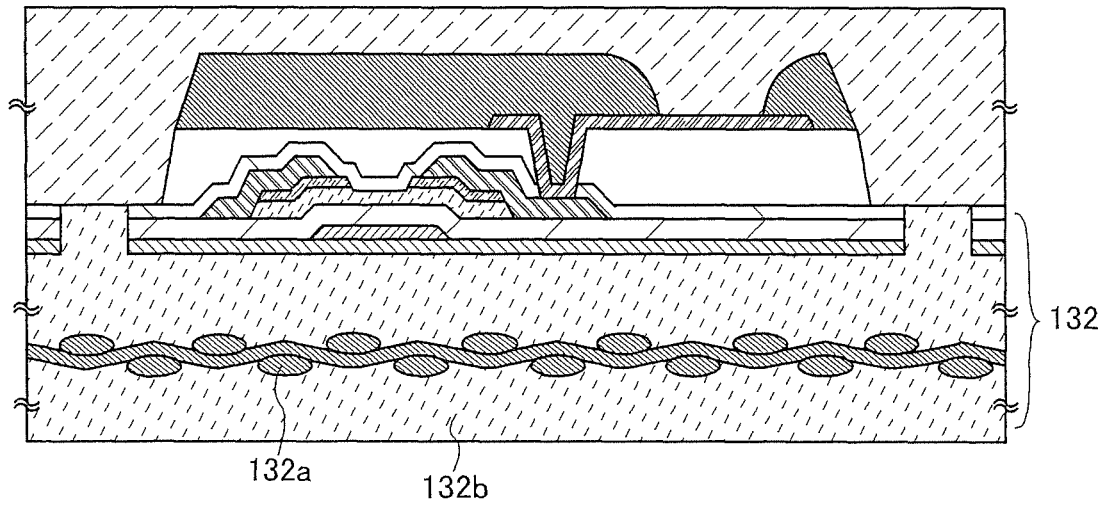

Next, a structure body in which a fibrous body is impregnated with an organic resin is provided on a separation surface of the element formation layer 324 which is separated (the surface of the insulating layer 104 exposed by separation), and then the structure body is heated and subjected to pressure bonding, whereby the organic resin in the structure body is plasticized or cured, and the first structure body 132 in which the fibrous body 132a is impregnated with the organic resin 132b is provided on the element formation layer 324 (see FIG. 9C). Fixing of the structure body in which the fibrous body is impregnated with the organic resin can be performed under an atmospheric pressure or a reduced pressure. Note that when the organic resin of the structure body in which the fibrous body is impregnated with the organic resin is a plastic organic resin, the structure body in which the fibrous body is impregnated with the organic resin is heated and subjected to pressure bonding, and then the organic resin 132b which is cured by cooling to room temperature is included.

For the first structure body 132, the first structure body 132 described in Embodiment 2 can be used as appropriate.

Figure 10A:
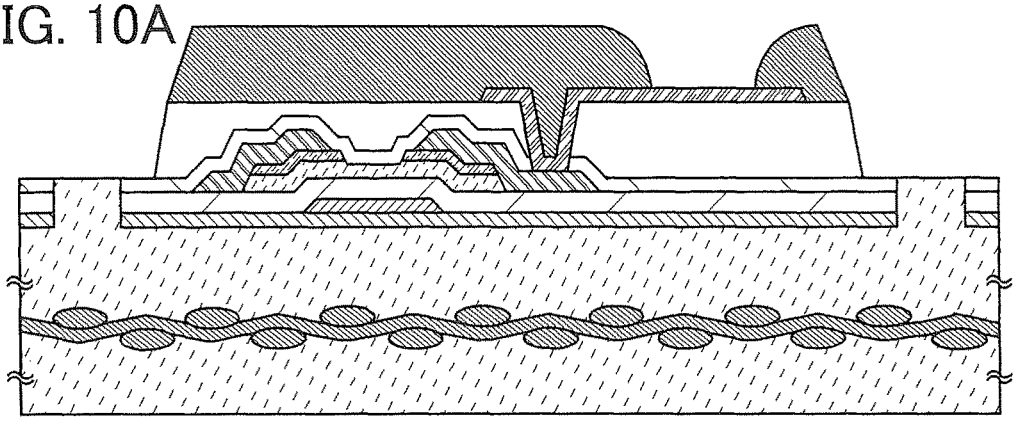
FIGS. 10A to 10C illustrate a method for manufacturing a light emitting device according to an embodiment of the present invention.

The first structure body 132 is subjected to pressure bonding, and then the adhesive sheet 328 is removed and the first electrode 322 is exposed (see FIG. 10A).

Next, an EL layer 360 is formed over the first electrode 322. The EL layer 360 can be formed using either a low molecular material or a high molecular material. Note that a material forming the EL layer 360 is not limited to a material containing only an organic compound material, and it may partially contain an inorganic compound material. Alternatively, the EL layer may have at least a light emitting layer, and a single-layer structure that is formed using a single light emitting layer or a stacked structure including layers having different functions may be used. Note that a layer having two or more functions of the respective functions of the layers may be included.

In addition, the EL layer 360 can be formed by either a wet process or a dry process, such as an evaporation method, an inkjet method, a spin coating method, a dip coating method, or a nozzle printing method.

Next, a second electrode 362 is formed over the EL layer 360. Accordingly, a light emitting element 340 in which the first electrode 322, the EL layer 360, and the second electrode 362 are stacked can be formed. Note that one of the first electrode 322 and the second electrode 362 is used as an anode, and the other is used as a cathode.

Figure 10B:
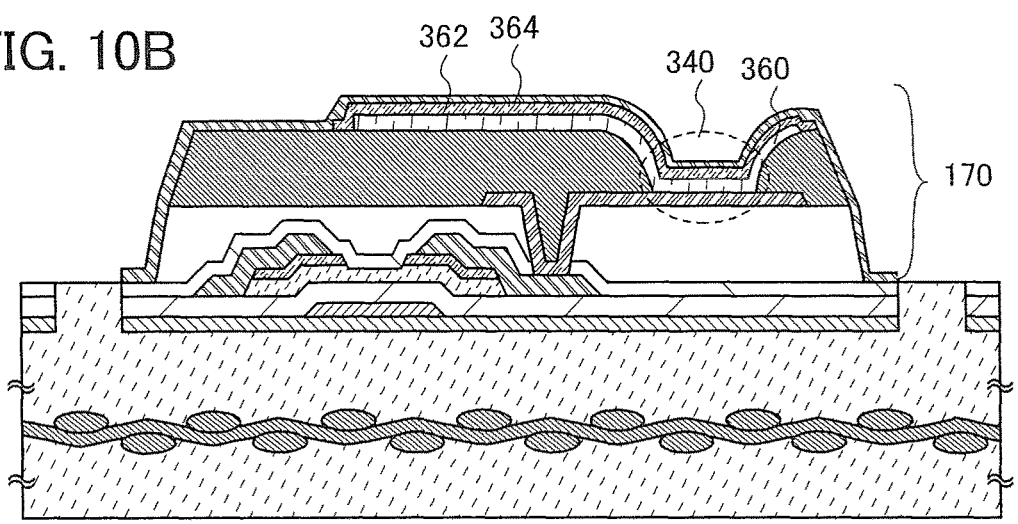

Next, an insulating layer 364 functioning as a protective layer is formed over the second electrode 362 so as to cover the light emitting element 340 (see FIG. 10B). Thus, the element portion 170 can be formed.

Figure 10C:
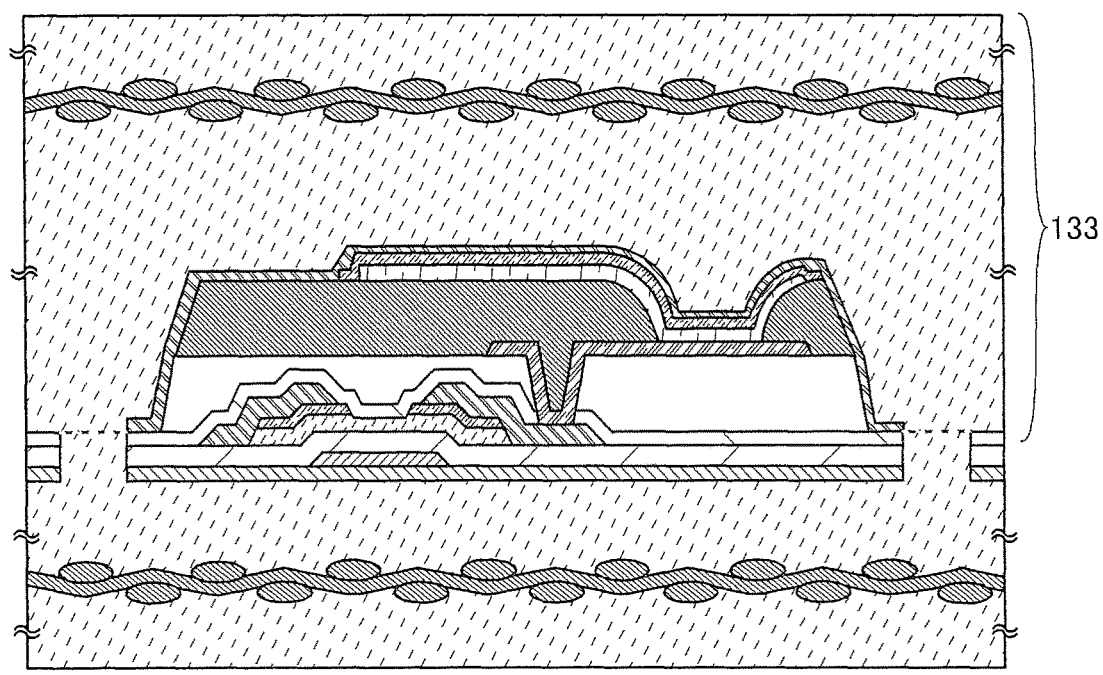

Next, the second structure body 133 is provided over the insulating layer 364. Similarly to the first structure body 132, a structure body in which a fibrous body is impregnated with an organic resin is used for the second structure body 133. Then, the second structure body 133 is heated and subjected to pressure bonding, and the second structure body 133 is bonded to the first structure body 132 in end portions where there is no element portion 170, whereby the element portion 170 including the light emitting element 340 can be sealed by the first structure body 132 and the second structure body 133 (see FIG. 10C).

Through the above process, the light emitting device of this embodiment having a light emitting element sealed by the first structure body and the second structure body can be formed.

As for the light emitting device of this embodiment, the element portion 170 is arranged in a substantially central portion in a cross section of the light emitting device, and in the end portions where there is no element portion 170, the first structure body 132 and the second structure body 133 are in contact with each other and fixed to each other, so that the element portion 170 is sealed. In addition, the first structure body 132 and the second structure body 133 include a region where the first structure body 132 and the second structure body 133 adhere to each other so as to surround the periphery of the element portion 170. The first structure body 132 and the second structure body 133 are formed using the same material, whereby adhesion of the first structure body and the second structure body can be improved.

Note that in this embodiment, as a method for forming the element formation layer 324, the method described in Embodiment 2 is used; however, the method described in Embodiment 3 can be used instead of the method.

In this embodiment, since a layer containing at least molybdenum is used for the separation layer, an element formation layer including a thin film transistor to be formed in a process at a low temperature of less than 500° C. can be easily separated from the separation layer and cannot be directly formed on a prepreg, and the element formation layer is fixed to the prepreg, whereby an element substrate can be formed. In addition, an EL display device can be formed using the element substrate.

Embodiment 5

In this embodiment, a method for manufacturing a display device with a small number of steps will be described. Specifically, a method for manufacturing a pixel portion of a display device having a thin film transistor with the use of an oxide semiconductor will be described. Here, an EL display device is used as the display device for illustrative purposes.

The first structure body 132 in which the fibrous body 132a is impregnated with the organic resin 132b is used as a substrate. Note that the organic resin 132b with which the fibrous body 132a in the first structure body 132 is impregnated is a cured or semi-cured organic resin.

Before the gate electrode 402 is formed over the first structure body 132 which is a substrate, an insulating layer 400 functioning as a base film may be provided between the first structure body 132 and the gate electrode 402. The insulating layer 400 is a layer which prevents moisture or impurities such as an alkali metal from diffusing from the first structure body 132 to a TFT element and a display device and deteriorating reliability of a semiconductor element formed on an element formation layer, and may be provided as appropriate as a blocking layer.

The insulating layer 400 is formed using an insulating material such as silicon oxide, silicon nitride, silicon oxynitride, or silicon nitride oxide. When the insulating layer 400 has a two-layer structure, for example, it is preferable to form a silicon nitride oxide layer as a first insulating layer, and to form a silicon oxynitride layer as a second insulating layer. Alternatively, a silicon nitride layer may be fainted as the first insulating layer, and a silicon oxide layer may be formed as the second insulating layer.

Figure 11A:
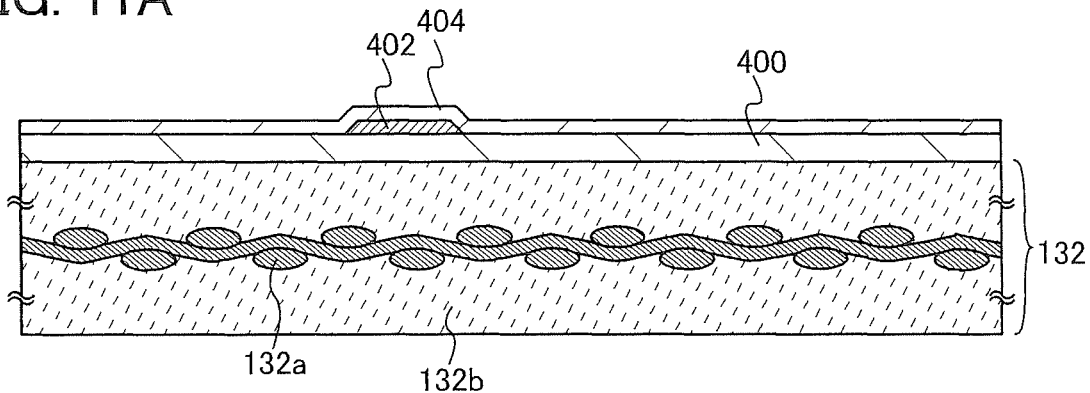
FIGS. 11A to 11C illustrate a method for manufacturing a light emitting device according to an embodiment of the present invention.

Next, the gate electrode 402 is formed over the first structure body 132, and the gate insulating layer 404 is formed over the gate electrode 402 (see FIG. 11A). The gate electrode 402 and the gate insulating layer 404 are formed as appropriate using the gate electrode 306 and the gate insulating layer 308, respectively described in Embodiment 4.

Next, a resist mask formed using a photomask is used, and a contact hole is formed in the gate insulating layer 404, whereby a contact pad of the gate electrode 402 is exposed. At the same time, the peripheral portion of the EL display device may be removed by dry etching.

A semiconductor layer 408 is formed using an oxide semiconductor layer. For the oxide semiconductor layer, composite oxide of an element selected from indium, gallium, aluminum, zinc, and tin can be used. For example, zinc oxide (ZnO), indium oxide. (IZO) containing zinc oxide, and oxide containing indium oxide, gallium oxide, and zinc oxide (IGZO) can be given. An oxide semiconductor can be directly formed on a prepreg by using a method in which a film can be deposited at a temperature that is lower than heat-resistant temperature of the prepreg, such as a sputtering method or a pulsed laser deposition method (PLD method).

The semiconductor layer 408 can be formed by a reactive sputtering method or a pulsed laser deposition method (PLD method). The semiconductor layer may be formed to have a thickness of greater than or equal to 10 nm and less than or equal to 200 nm, preferably, greater than or equal to 20 nm and less than or equal to 150 nm. In addition, when oxygen deficiency in a film is increased, carrier density is increased, and a property of a thin film transistor is lost. Therefore, oxygen concentration of a film formation atmosphere may be controlled.

In the case of oxide formed using indium oxide, gallium oxide, and zinc oxide, the composition ratio of a metal element has a high degree of freedom, and the oxide formed using indium oxide, gallium oxide, and zinc oxide functions as a semiconductor in a wide range of mixing ratio. A material (IGZO) in which indium oxide (IZO) containing 10 weight % of zinc oxide and oxide formed using indium oxide, gallium oxide, and zinc oxide are mixed at an equimolar ratio can be given as an example.

Here, as an example of a method for forming the semiconductor layer 408, a method using IGZO is described. Indium oxide ($In_2O_3$), gallium oxide ($Ga_2O_3$), and zinc oxide (ZnO) are mixed at an equimolar ratio, and a target with a diameter of 8 inches that is sintered is used with an output of 500 W by direct current (DC) sputtering, whereby a semiconductor layer is formed to a thickness of 100 nm under conditions that pressure in a chamber is 0.4 Pa and a gas composition ratio of $Ar/O_2$ is 10/5 sccm. It is preferable that oxygen partial pressure in formation be set higher than that of formation condition of a light-transmitting conductive film formed using indium tin oxide (ITO) or the like, and it is preferable that oxygen deficiency be suppressed.

Figure 11B:
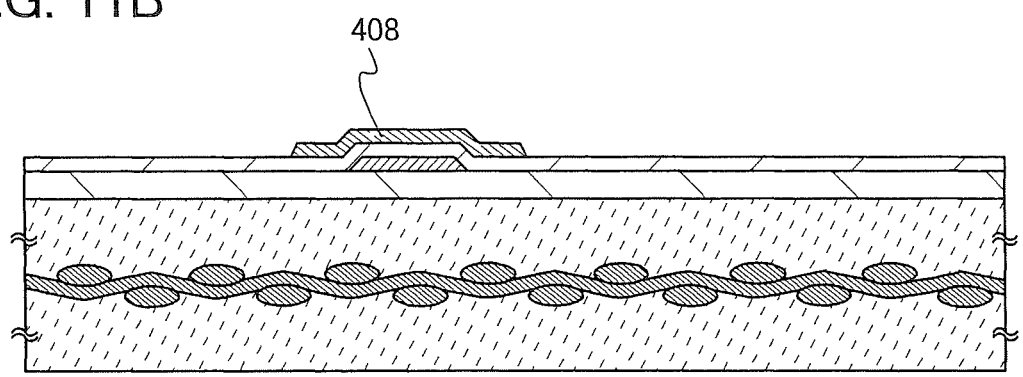

After the semiconductor layer is formed, a resist mask which is formed using a photomask is used, and etching is performed by dilute hydrochloric acid or organic acid, for example, citric acid, whereby the semiconductor layer 408 is formed (see FIG. 11B). Next, a photoresist is separated using an organic solvent.

Next, wirings 412 and 414 are formed over the semiconductor layer 408. The wirings 412 and 414 can be formed using a material which is similar to that of the wiring 314 described in Embodiment 4.

Figure 11C:
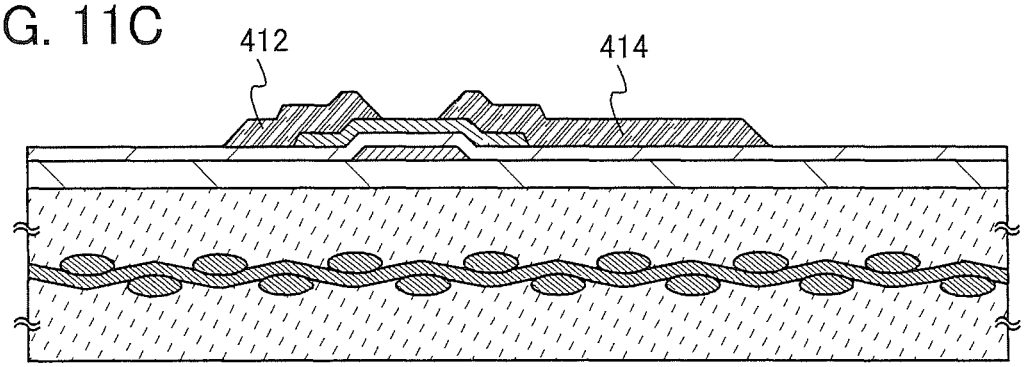

After a resist mask is formed over at least the semiconductor layer 408, a conductive layer is formed over the resist mask, the semiconductor layer 408, and the gate insulating layer 404 by a sputtering method or a vacuum evaporation method. The resist mask is separated, and the wirings 412 and 414 by which part of the semiconductor layer 408 is exposed are formed by a lift-off method, as illustrated in FIG. 11C.

Through the above process, a thin film transistor in which a semiconductor layer is formed using an oxide semiconductor can be formed. In a manner similar to the manner in which the thin film transistor described in Embodiment 2 is formed, the thin film transistor according to this embodiment can also be applied to a switching transistor in a pixel of a display device typified by an EL display device.

Next, an insulating layer 418 having openings 420 and 422 is formed. The insulating layer 418 can be formed in a manner similar to the manner in which the insulating layer 316 described in Embodiment 4 is formed. When the insulating layer is formed on the entire surface of the substrate, a resist mask is formed by a photolithography method, and the insulating layer is etched using the resist mask, whereby the openings 420 and 422 can be formed. Alternatively, the insulating layer 418 having the openings 420 and 422 may be formed by a printing method or a droplet discharging method.

Figure 12A:
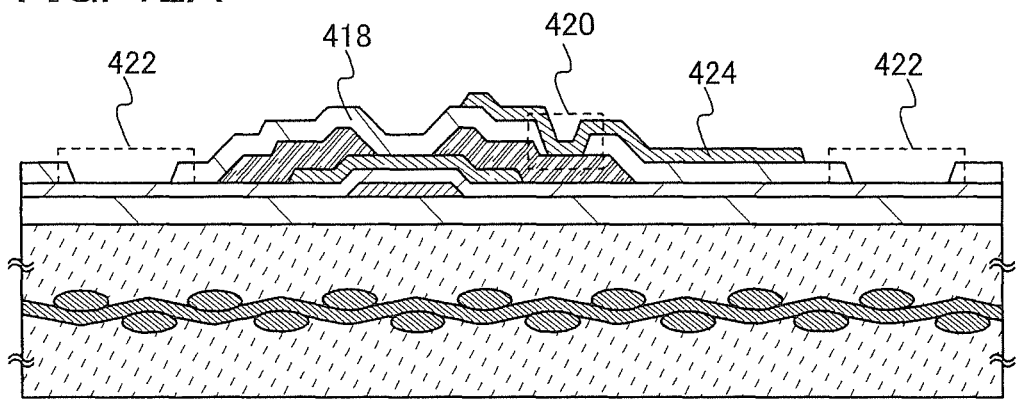
FIGS. 12A to 12C illustrate a method for manufacturing a light emitting device according to an embodiment of the present invention.

Next, a first electrode 424 is provided over the insulating layer 418 so as to be connected to the wiring 414 through the opening 420. In such a manner, a switching thin film transistor in a pixel of a display device which is illustrated in FIG. 12A can be manufactured.

Note that the first electrode 322 described in Embodiment 4 can be used for the first electrode 424, as appropriate.

By the above process, a thin film transistor can be formed over a prepreg. In this embodiment, a thin film transistor can be directly formed on the prepreg without a separation process being used; therefore, the number of manufacturing steps of a flexible element substrate can be reduced.

Figure 12B:
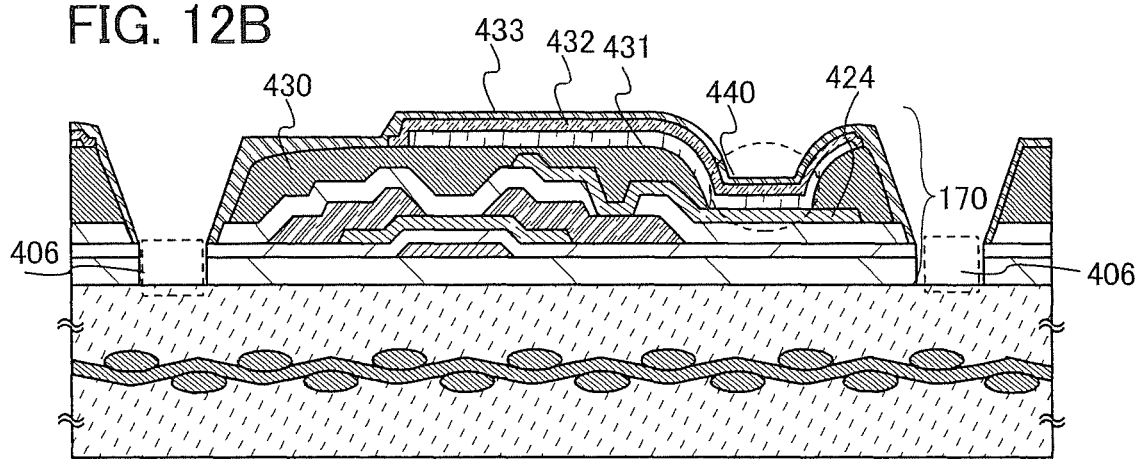

Next, an insulating film 430 is formed to cover an end portion of the first electrode 424 as illustrated in FIG. 12B. The insulating film 430 is also referred to as a partition wall, a barrier, a bank, or the like, and a photosensitive or non-photosensitive organic material (polyimide, acrylic, polyimide, polyimide amide, a resist, or benzocyclobutene) or an SOG film (for example, a silicon oxide film containing an alkyl group) is used with a thickness in a range of 0.8 μm to 1 μm.

Many oxide semiconductors functioning as an active layer of a TFT, for example, zinc oxide (ZnO), indium oxide (IZO) containing zinc oxide, oxide (IGZO) containing indium oxide, gallium oxide, and zinc oxide, and the like are n-type semiconductors; therefore, a drain electrode of a TFT in which any of these compounds is included in an active layer serves as a cathode.

On the other hand, when the light emitting element in which an organic compound serves as a light emitting substance is connected to a TFT and driven, it is preferable that the light emitting element be connected to the drain electrode side to avoid a change of gate voltage in accordance with driving. Therefore, the first electrode 424 that is connected to the drain electrode serves as a cathode, and an EL layer 431 and a second electrode 432 functioning as an anode are sequentially stacked thereover (see FIG. 12B). Note that the EL layer 431 can be formed using a material which is similar to that of the EL layer 134 of Embodiment 2 by a dry process such as an evaporation method or a wet process such as inkjet method. In addition, the second electrode 432 is formed by an evaporation method or a sputtering method.

The EL layer 431 is not formed using a single layer and is formed using a plural-layer structure including an electron injecting layer, an electron transporting layer, a light emitting layer, a hole transporting layer, a hole injecting layer, and the like, an electron injecting layer, an electron transporting layer, a light emitting layer, a hole transporting layer, a hole injecting layer, and the like are stacked in this order over the first electrode 424 functioning as a cathode, and finally, the second electrode 432 is formed as an anode. Thus, a light emitting element 440 in which the first electrode, the EL layer, and the second electrode are stacked can be formed.

Note that in order to extract light emitted from the light emitting layer which includes an organic compound as a light emitting substance to outside, it is preferable that one or both of the first electrode 424 and the second electrode 432 be light-transmitting electrodes made of indium tin oxide (ITO) or the like or be formed with a thickness of several to several tens of nanometers so as to be able to transmit visible light.

Next, an insulating layer 433 is provided so as to completely cover the light emitting element 440. In a manner similar to the manner in which the insulating layer 138 is formed, the insulating layer 433 is formed using an insulating film including a carbon film, a silicon nitride film, or a silicon nitride oxide film in a single layer or in a stack in which these films are combined. At this time, a film with good coverage is preferably used as the insulating layer 433. Thus, the element portion 170 having the light emitting element 440 can be formed.

Next, a peripheral portion of the element portion 170 is processed like the grooves 406 illustrated in FIG. 12B. That is, when there is the insulating layer 400 functioning as a base film, the insulating layer 400, the gate insulating layer 404. and the insulating layer 433 are dry etched to form the grooves 406. The protective film, the insulating layer, and the insulating layer 400 functioning as a base film in the peripheral portion of the EL display device are removed, whereby prepregs can be thermally bonded to each other in a later process. A mixed gas of $CHF_3$ is used in dry etching; however, this embodiment is not limited to this.

Figure 12C:
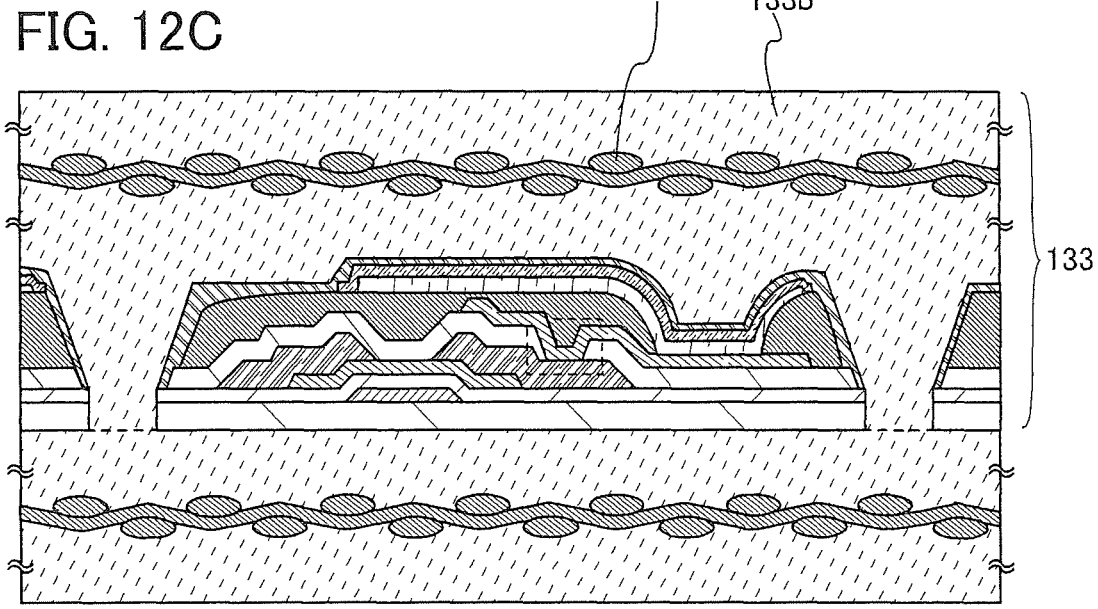

Next, the second structure body 133 in which a fibrous body 133a is impregnated with an organic resin 133b is provided on the surface of the insulating layer 433 (see FIG. 12C). Then, the first structure body 132 and the second structure body 133 are heated, and the organic resins 132b and 133b in the structure bodies are subjected to pressure bonding in the grooves 406 through the opening 422, whereby the organic resins 132b and 133b are plasticized or cured to be bonded to each other.

Through the above process, a light emitting device of an embodiment of the present invention having a light emitting element sealed by the first structure body and the second structure body can be formed.

As for the light emitting device of this embodiment, the element portion 170 is arranged in a substantially central portion in a cross section of the light emitting device, and in the end portions where there is no element portion 170, the first structure body 132 and the second structure body 133 are in contact with each other and fixed to each other, so that the element portion 170 is sealed. In addition, the first structure body 132 and the second structure body 133 include a region where the first structure body 132 and the second structure body 133 adhere to each other so as to surround the periphery of the element portion 170. The first structure body 132 and the second structure body 133 are formed using the same material, whereby adhesion of the first structure body and the second structure body can be improved.

In the light emitting device of an embodiment of the present invention, a pair of structure bodies which seals an element portion functions as an impact resistant layer against force (also referred to as external stress) applied to the light emitting device from the outside. The structure bodies are provided, whereby force which is locally applied can be reduced; therefore, damage or defective characteristics of the light emitting device due to the external stress can be prevented. Thus, a highly reliable light emitting device that is reduced in thickness and size and has tolerance can be provided. Further, a light emitting device can be manufactured with a high yield by preventing defects of a shape and characteristics caused by the external stress in a manufacture process.

In this embodiment, since a thin film transistor can be formed over the prepreg, the number of manufacturing steps of a flexible element substrate can be reduced. In addition, an EL display device can be formed using the element substrate.

Embodiment 6

In this embodiment, another example of a light emitting device for providing high reliability by using an embodiment of the present invention and a method for manufacturing the light emitting device will be described. More specifically, a method for manufacturing a light emitting device of an embodiment of the present invention having a pair of impact relief layers on outer sides of (on a side which is a side opposing a light emitting element) the pair of structure bodies illustrated in FIG. 1B will be described.

Figure 13A:
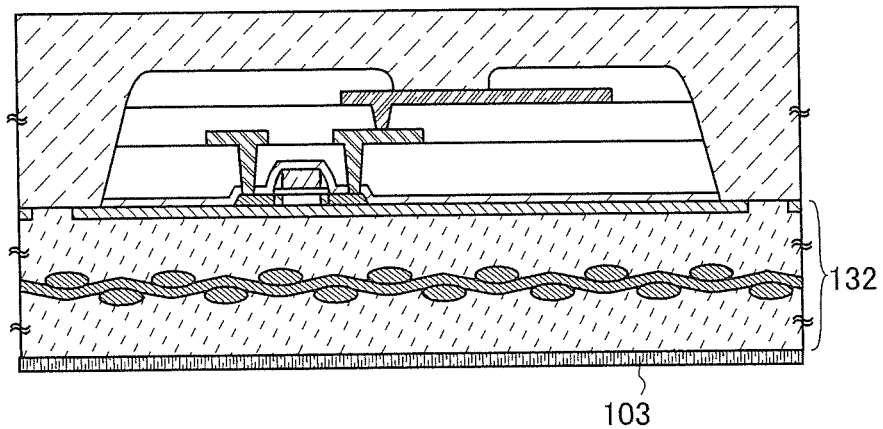
FIGS. 13A to 13C illustrate a method for manufacturing a light emitting device according to an embodiment of the present invention.

A method for manufacturing a light emitting device of this embodiment is described with reference to FIGS. 13A to 13C. First, the element formation layer 124 is formed over the substrate 100, and the element formation layer 124 is separated from the substrate 100 by using an adhesive sheet in a manner similar to the process described with reference to FIGS. 2A to 2E, FIGS. 3A to 3C, and FIGS. 4A and 4B in Embodiment 2.

Next, the first structure body 132 and the first impact relief layer 103 are stacked, and the first structure body 132 is heated and subjected to pressure bonding, whereby the first structure body 132 and the element formation layer 124 are fixed to each other, and the first structure body 132 and the first impact relief layer 103 are fixed to each other. A process of bonding the element formation layer 124 to the first structure body 132, and a process of bonding the first structure body 132 to the first impact relief layer 103 may be performed at the same time, or may be performed separately (see FIG. 13A).

It is preferable to use a material that has a low modulus of elasticity and a high breaking strength for an impact relief layer. For example, a film having rubber elasticity in which the modulus of elasticity is higher than or equal to 5 GPa and less than or equal to 12 GPa and the modulus of rupture is higher than or equal to 300 MPa can be used.

Next, the EL layer 134 is formed over the first electrode 122. The EL layer 134 can be formed using either a low molecular material or a high molecular material. Note that, a material forming the EL layer 134 is not limited to a material containing only an organic compound material, and it may partially contain an inorganic compound material. Alternatively, the EL layer may have at least a light emitting layer, and may have a single-layer structure that is formed using a single light emitting layer or a stacked structure including layers each having a different function. Note that a layer having two or more functions of the respective functions of the layers may be included.

In addition, the EL layer 134 can be formed by either a wet process or a dry process, such as an evaporation method, an inkjet method, a spin coating method, a dip coating method, or a nozzle printing method.

Next, the second electrode 136 is formed on the EL layer 134. Accordingly, the light emitting element 140 in which the first electrode 122, the EL layer 134, and the second electrode 136 are stacked can be formed. Note that one of the first electrode 122 and the second electrode 136 is used as an anode, and the other is used as a cathode.

Figure 13B:
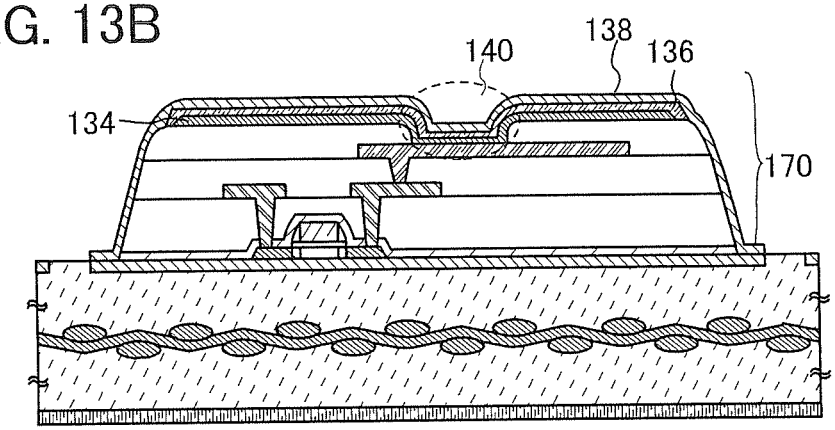

Next, the insulating layer 138 functioning as a protective layer is formed over the second electrode 136 to cover the light emitting element 140 (see FIG. 13B). Thus, the element portion 170 can be formed.

Next, the second structure body 133 and the second impact relief layer 113 are stacked over the insulating layer 138. A structure body in which a fibrous body is impregnated with an organic resin is used for the second structure body 133, in a manner similar to the first structure body 132. Then, the second structure body 133 is heated and subjected to pressure bonding, so that the second structure body 133 is plasticized or cured, and the second structure body 133 is fixed to the second impact relief layer 113 and the second structure body 133 is bonded to the first structure body 132 in the end portions where there is no element portion 170. By this process, the element portion 170 including the light emitting element 140 can be sealed by the first structure body 132 and the second structure body 133 (see FIG. 13C).

A step in which the structure body is subjected to pressure bonding is performed under an atmospheric pressure or a reduced pressure.

Accordingly, a light emitting device of an embodiment of the present invention which has a pair of impact relief layers and a light emitting element sealed by a pair of structure bodies can be formed.

Bonding of the first structure body 132 to the first impact relief layer 103, and bonding of the second structure body 133 to the second impact relief layer 113 can be performed by direct-heating and pressure treatment without a bonding layer because a prepreg that is a structure body in which a fibrous body is impregnated with an organic resin is used for the first structure body 132 and the second structure body 133.

Figure 13C:
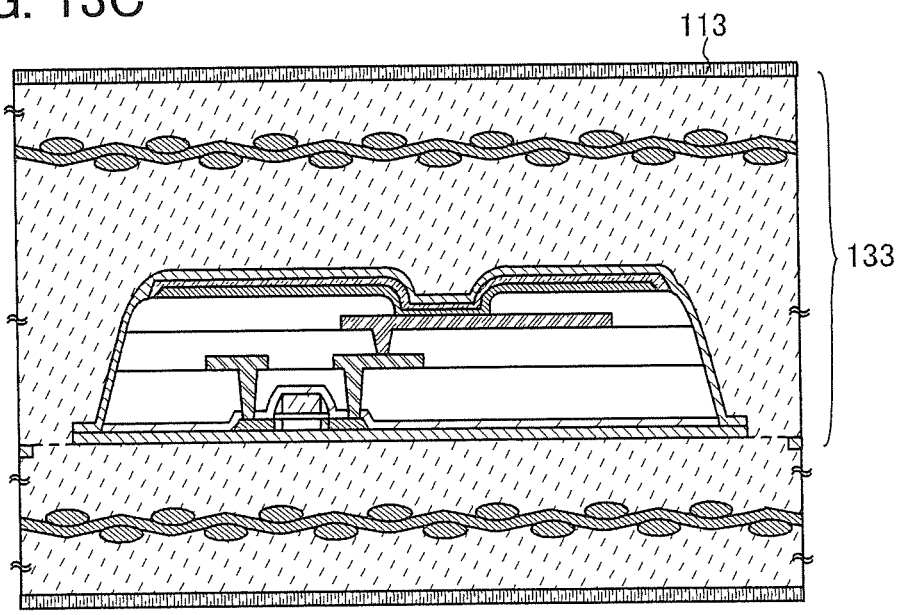

As illustrated in FIG. 13C, the element portion 170 is placed at a central portion of the first structure body 132 and the second structure body 133; in the end portions where there is no element portion 170, the first structure body 132 and the second structure body 133 are in contact with each other, and the element portion 170 including the light emitting element 140 is sealed.

In this manner, with the use of a pair of structure bodies that seals a light emitting element, a highly reliable light emitting device which is reduced in thickness and size and has tolerance can be provided. Further, a light emitting device can be manufactured with a high yield by preventing defects of a shape and characteristics due to external stress in a manufacture process.

In addition, if a pair of structure bodies and a pair of impact relief layers are symmetrically provided with respect to the element portion 170 as in this embodiment, force applied to the light emitting device can be uniformly diffused, damage of the element portion due to bending, warpage, or the like can be prevented. When a pair of structure bodies is formed using the same material and has the same thickness and a pair of impact relief layers is formed using the same material and has the same thickness, this effect can provide an equivalent property; therefore, the diffusion effect of force is further enhanced.

Note that this embodiment can be freely combined with any of other embodiments.

Embodiment 7

In this embodiment, another example of a light emitting device which is different from the light emitting device described in Embodiment 1, and a manufacturing method thereof will be described with reference to FIGS. 14A and 14B and FIGS. 15A to 15D.

In this embodiment, an example in which the light emitting device illustrated in FIG. 1A in Embodiment 1 is provided with a conductive layer is described. Since the conductive layer can be provided on the outermost surface of a light emitting device, a conductive layer may be provided on each surface of outer sides of a pair of structure bodies (on the side opposing the light emitting element side). Note that in the case where the impact relief layers are provided on the outer side of a structure body as illustrated in FIG. 1B, conductive layers can be provided on surfaces of outer sides of the impact relief layer.

The conductive layer diffuses static electricity applied by electrostatic discharge to discharge it or prevents local electric charges (localization of electric charges) (prevents local potential difference) so that electrostatic breakdown of the element portion 170 can be prevented. The conductive layer is formed so as to cover (overlap) both surfaces of the element portion 170 with an insulator interposed therebetween. Note that the conductive layer and the element portion 170 are not electrically connected to each other.

The conductive layer is provided on the entire surface of a region overlapped with the element portion 170 so as to cover at least the element portion 170.

The conductive layer may be provided on each surface of both the first structure body and the second structure body in the light emitting device, or one of the surfaces.

Figure 14A:
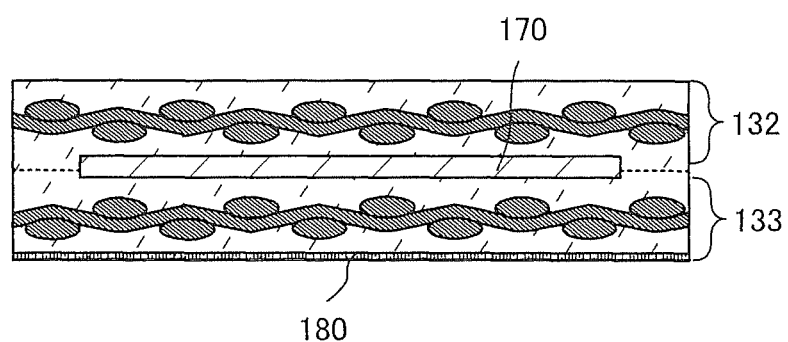
FIGS. 14A and 14B each illustrate a light emitting device according to an embodiment of the present invention.
Figure 14B:
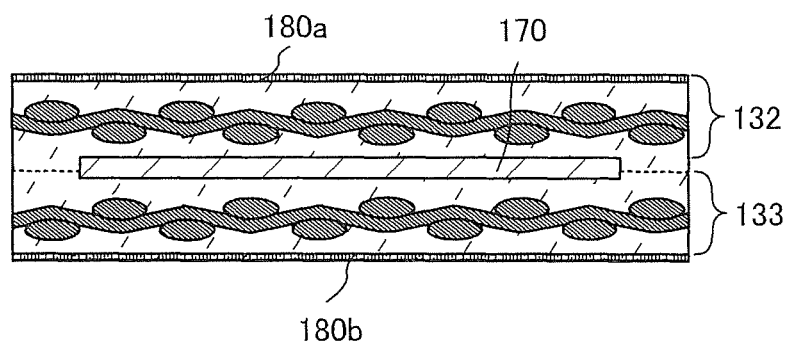

An example in which a conductive layer 180 is provided on an outer side of the second structure body 133 (on the side opposing the light emitting element 140 side) is illustrated in FIG. 14A. In addition, an example in which a first conductive layer 180a and a second conductive layer 180b are provided on an outer side of the first structure body 132 and on an outer side of the second structure body 133, respectively is illustrated in FIG. 14B. Note that in FIG. 14B, the first conductive layer 180a and the second conductive layer 180b are not electrically connected to each other.

When conductive layers are provided on the first structure body 132 side and the second structure body 133 side, the conductive layers may be formed so as to be electrically connected to each other.

The conductive layers may be formed to cover the entire periphery of a light emitting device (a top surface, a bottom surface, and a side surface) (to wrap the light emitting device), or a conductive region that electrically connects a pair of conductive layers provided on outer sides of both impact resistant layers may be formed. The conductive region may be part of a side surface of the light emitting device, or may be an electrode layer penetrating the inside of the light emitting device. Note that the side surface of the light emitting device means a section surface (a divided surface) formed when a plurality of light emitting elements provided on one insulator is cut (divided) in individual light emitting elements. The cross section may be entirely covered by a conductive layer, or may be partly covered.

Note that when a conductive layer is formed so as to cover the entire periphery of the light emitting device (a top surface (a surface), a bottom surface (a back surface), and a side surface), the conductive layer 180 is formed using a light transmitting material at least for a display of the light emitting device or to have a thickness through which light is transmitted.

Figure 15A:
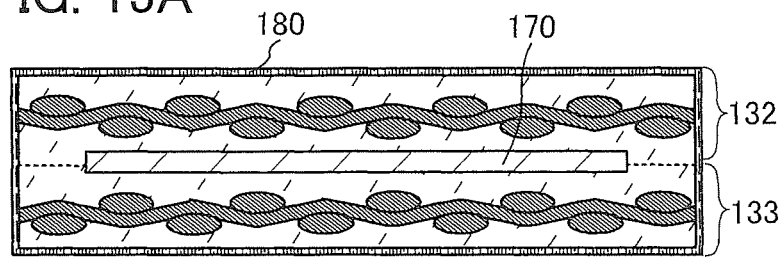
FIGS. 15A to 15D each illustrate a light emitting device according to an embodiment of the present invention.
Figure 15B:
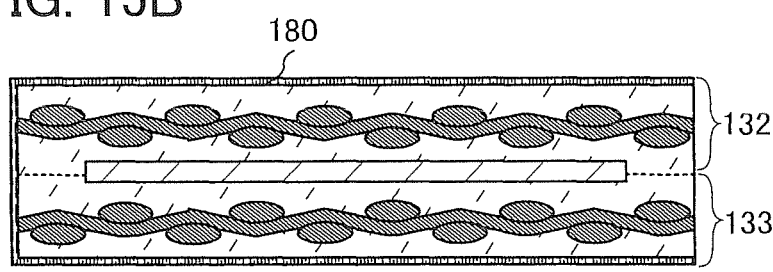
Figure 15C:
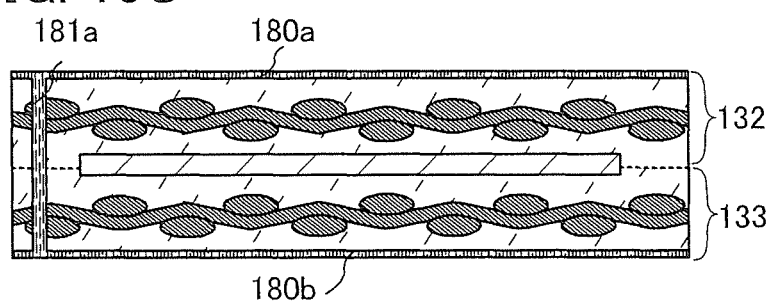
Figure 15D:
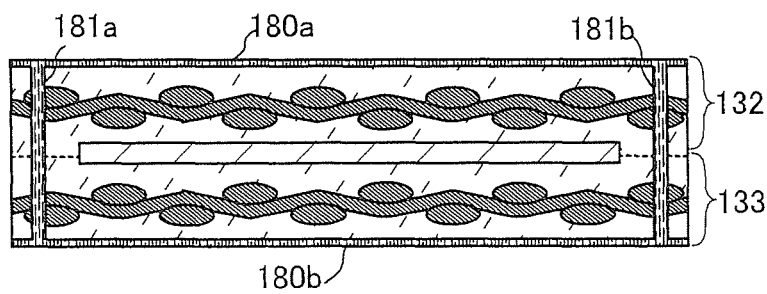

FIG. 15A is an example in which the conductive layer 180 is formed so as to cover the entire periphery of a light emitting device (a top surface (a surface), a bottom surface (a back surface), and a side surface). FIG. 15B illustrates a structure in which the conductive layer 180 covers at least one side surface. FIG. 15C is an example in which the first conductive layer 180a and the second conductive layer 180b formed on surfaces are electrically connected to each other using an electrode layer 181a that penetrates the inside of the light emitting device, and FIG. 15D is an example in which the first conductive layer 180a and the second conductive layer 180b formed on the surfaces are electrically connected to each other using the electrode layer 181a and an electrode layer 181b. A through-hole which forms the electrode layer may be processed by physical treatment such as a needle or a drill, or may be processed by chemical treatment by etching or the like. In addition, a laser beam may be used.

In FIGS. 15A to 15D, since the conductive layers that are electrically connected to both the surface and the back surface are provided, a broad region is protected against static electricity from the outside, and a higher effect of preventing electrostatic discharge breakdown can be obtained.

After the element portion 170 is sealed by a pair of structure bodies, the conductive layers may be formed by a sputtering method or the like on the surfaces of the structure bodies. When conductive layers are formed on each of a pair of structure bodies, the conductive layers may be formed by a plurality of steps.

As illustrated in FIG. 1B, when an impact relief layer is provided on an outer side of a structure body (on the side opposing a light emitting element), a conductive layer may be formed on the impact relief layer before the impact relief layer is bonded to the structure body.

In FIGS. 15A to 15D, at least parts of the first conductive layer 180a and the second conductive layer 180b are electrically connected to each other, and the first conductive layer 180a and the second conductive layer 180b have the same potential.

The first conductive layer 180a and the second conductive layer 180b have the same potential, whereby an effect of protection against static electricity can be obtained. Before charge is built up by static electricity and an element portion including a light emitting element is damaged, both top and bottom surfaces in the light emitting device have the same potential, so that the element portion is protected.

For example, when the first structure body and the second structure body each are a structure body in which a fibrous body is impregnated with an organic resin, aramid films can be used for the first impact relief layer and the second impact relief layer, and a titanium film can be used for the conductive layer. When the first structure body and the second structure body each have a thickness of greater than or equal to 10 μm and less than or equal to 30 μm, the first impact relief layer and the second impact relief layer each have a thickness of greater than or equal to 3 μm and less than or equal to 15 μm, and the element portion including the light emitting element has a thickness of greater than or equal to 1 μm and less than or equal to 5 μm, each thickness of the first structure body, the second structure body, the first impact relief layer, and the second impact relief layer is larger than the thickness of the element portion; therefore, the element portion can be provided in a substantially central portion, whereby a light emitting device which has high resistance to bending stress can be provided.

The conductive layer may have conductivity, and a conductive layer formed using a conductive material can be used.

For the conductive layer, a film of metal, metal nitride, metal oxide, or the like, or a stack of any of the films can be used.

The conductive layer may be formed using, for example, an element such as titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a compound material, a nitride material, or an oxide material each containing any of the above elements as its main component.

As the nitride material, tantalum nitride, titanium nitride, or the like can be used.

As the oxide material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

Alternatively, a semiconductor film having conductivity, which is obtained by adding an impurity element or the like to a semiconductor, or the like can be used. For example, a polycrystalline silicon film or the like doped with an impurity element such as phosphorus can be used.

Still alternatively, a conductive macromolecule (also referred to as a conductive polymer) may be used for the conductive layer. As the conductive polymer, a so-called π-electron conjugated conductive polymer can be used. For example, polyaniline and/or a derivative thereof, polypyrrole and/or a derivative thereof, polythiophene and/or a derivative thereof, and a copolymer of two or more kinds of those materials can be given.

The conductive layer can be formed by a dry process such as a sputtering method, a plasma CVD method, or an evaporation method, or a wet process such as a coating method, a printing method, or a droplet discharging method (inkjet method). Alternatively, various plating methods such as electroplating or electroless plating may be used.

Note that the conductive layer 180 is formed using a light transmitting material on at least a display of a light emitting device or is formed to have a thickness through which light passes. When the conductive layer 180 is provided on another surface which does not serve as the display of the light emitting device, a conductive layer does not necessarily have a light transmitting property.

Further, a protective layer may be stacked over the conductive layer. For example, it is preferable that a titanium film be formed as the conductive layer and a titanium oxide film be stacked over the titanium film as a protective layer. Even in the case where the conductive layer is provided on a surface of a light emitting device, the conductive layer can be prevented from being degraded because a protective layer is formed on the outermost surface of the light emitting device.

With the use of the conductive layer covering the element portion 170, electrostatic breakdown (malfunctions of the circuit or damage of a semiconductor element) of the element portion 170 clue to electrostatic discharge is prevented. Further, with the use of the pair of structure bodies which seals the element portion 170, a highly reliable light emitting device that is reduced in thickness and size and has tolerance can be provided. In addition, shape defects and defective characteristics due to external stress or electrostatic discharge can also be prevented in the manufacturing process, so that a light emitting device can be manufactured with a high yield.

Embodiment 8

In this embodiment, an example of a method for manufacturing a light emitting device having a conductive layer that is electrically connected to both surfaces (a top surface and a bottom surface) of the light emitting device described in Embodiment 7 will be described with reference to FIGS. 16-A1, 16-A2, 16-B1, and 16-B2. FIGS. 16-A2 and 16-B2 are plan views, and FIGS. 16-A1 and 16-B1 are cross-sectional views taken along lines E-F of FIGS. 16-A2 and 16-B2, respectively.

A light emitting device of this embodiment in a manufacturing process is illustrated in FIGS. 16-A1 and 16-A2. A plurality of element portions 170 is sealed by the first impact relief layer 103, the second impact relief layer 113, the first structure body 132, and the second structure body 133, and a stack 144 is formed. The stack 144 is in a state before separation into individual light emitting devices and includes a plurality of element portions 170. The first structure body 132 and the second structure body 133 are in contact with each other in the space between the plurality of element portions 170, a seal region where adhesion is performed is provided, and the element portions 170 are sealed individually.

The first conductive layer 180a is formed on the outer surface of the first impact relief layer 103, which is the outermost surface of the stack 144, and the second conductive layer 180b is formed on the outer surface of the second impact relief layer 113.

The stack 144 provided with the first conductive layer 180a and the second conductive layer 180b is divided into individual light emitting devices 145a, 145b, 145c, 145d, 145e, and 145f having element portions (see FIGS. 16-B1 and 16-B2). The light emitting devices 145a, 145b, 145c, 145d, 145e, and 145f each include a stack 143 that is formed such that the stack 144 is divided.

In this embodiment, the first conductive layer 180a and the second conductive layer 180b are electrically connected to each other by a division process of the light emitting device (a division process of individual light emitting elements). For a division means, it is preferable to use a means by which the first impact relief layer 103, the second impact relief layer 113, the first structure body 132, and the second structure body 133 are melted at the time of division (it is more preferable to use a means by which the first conductive layer 180a and the second conductive layer 180b are melted). In this embodiment, division is performed by laser irradiation.

Conditions such as a wavelength and intensity of a laser beam, and a beam size to be used in the division process are not particularly limited as far as at least the light emitting device can be divided. For an oscillator of a laser beam, the following can be used: a continuous wave laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium cadmium laser; or a pulsed laser such as an Ar laser, a Kr laser, an excimer (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser.

As described in this embodiment, the light emitting devices are divided into the individual light emitting devices 145a, 145b, 145c, 145d, 145e, and 145f by laser irradiation, whereby resistance value between the first conductive layer 180a and the second conductive layer 180b decreases and the first conductive layer 180a and the second conductive layer 180b are brought into a conductive state. Therefore, a step of division into individual light emitting devices and a step of making the first conductive layer 180a and the second conductive layer 180b conductive can be performed at one time.

Through the above process, the light emitting devices 145a, 145b, 145c, 145d, 145e, and 145f each having a light emitting element can be formed as a light emitting device of this embodiment.

In this embodiment, with the use of the conductive layer covering the element portion, electrostatic breakdown (malfunctions of the circuit or damage of a semiconductor element) of the element portion 170 due to electrostatic discharge is prevented. Further, with the use of the pair of structure bodies and the pair of impact relief layers by which the element portion 170 is sealed, a highly reliable light emitting device that is reduced in thickness and size and has tolerance can be provided. In addition, shape defects and defective characteristics due to external stress or electrostatic discharge can also be prevented in the manufacturing process, so that a light emitting device can be manufactured with a high yield.

Embodiment 9

Figure 17A:
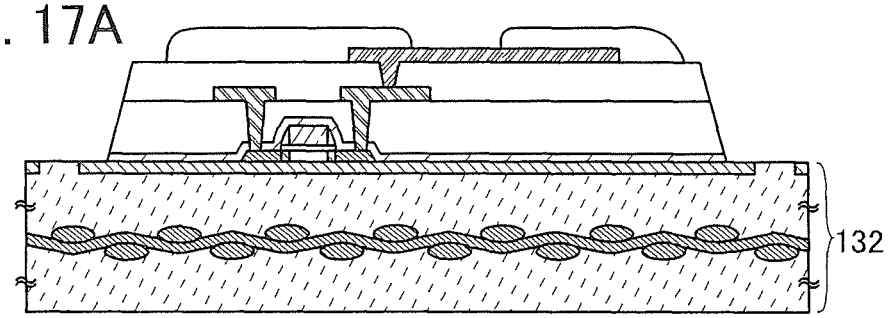
FIGS. 17A to 17C illustrate a method for manufacturing a light emitting device according to an embodiment of the present invention.

In this embodiment, another example of a light emitting device and a method for manufacturing the light emitting device will be described with reference to FIGS. 17A to 17C.

A method for manufacturing the light emitting device of this embodiment will be described with reference to FIGS. 17A to 17C. First, the element formation layer 124 is formed over the substrate 100 by a process similar to the process illustrated in FIGS. 2A to 2E, FIGS. 3A to 3C, and FIG. 4A described in Embodiment 2, and the element formation layer 124 is separated from the substrate 100 by using an adhesive sheet, and then the element formation layer 124 and the first structure body 132 are fixed to each other. The first structure body 132 is plasticized, semi-cured, or cured, and then the adhesive sheet is removed (see FIG. 17A).

Next, the EL layer 134 is formed over the first electrode 122. The EL layer 134 can be formed using either a low molecular material or a high molecular material. Note that the material forming the EL layer 134 is not limited to a material containing only an organic compound material, and may partially contain an inorganic compound material. Alternatively, the EL layer may have at least a light emitting layer, and may have a single-layer structure that is formed using a single light emitting layer or a stacked structure including layers each having a different function. Note that a layer having two or more functions of the respective functions of the layers may be included.

In addition, the EL layer 134 can be formed by either a wet process or a dry process, such as an evaporation method, an inkjet method, a spin coating method, a dip coating method, or a nozzle printing method.

Next, the second electrode 136 is formed over the EL layer 134. Accordingly, the light emitting element 140 in which the first electrode 122, the EL layer 134, and the second electrode 136 are stacked can be formed. Note that one of the first electrode 122 and the second electrode 136 is used as an anode, and the other is used as a cathode.

Figure 17B:
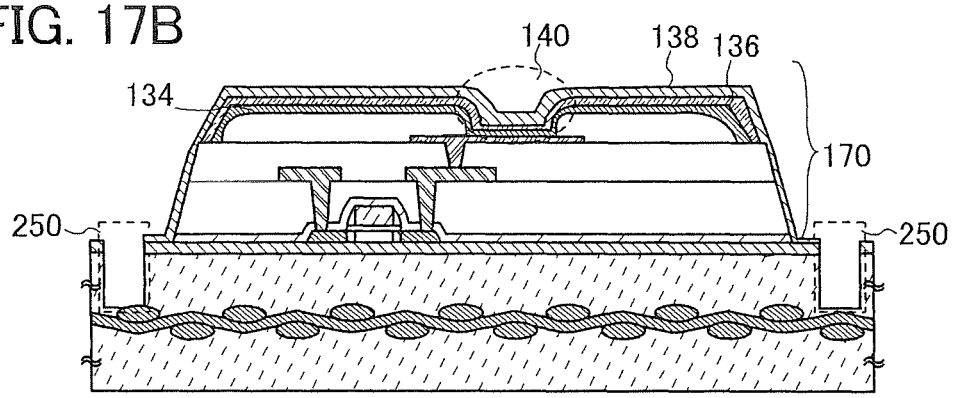

Next, the insulating layer 138 functioning as a protective layer is formed over the second electrode 136 (see FIG. 17B). Accordingly, the element portion 170 is formed.

Next, grooves 250 are formed in end portions of the first structure body 132 where there is no element portion 170 by laser irradiation or the like. It is preferable that a pair of grooves 250 be formed to sandwich the element portion 170, more preferably, to surround the periphery of the element portion 170. In this embodiment, grooves each having a width of 100 µm and a depth of 10 µm to 20 µm are formed by laser irradiation. Note that the grooves 250 may be formed before the EL layer 134 is formed.

Next, the second structure body 133 is provided over the insulating layer 138. A structure body in which a fibrous body is impregnated with an organic resin is used for the second structure body 133, in a manner similar to the first structure body 132. Then, the second structure body 133 is heated and subjected to pressure bonding, so that the second structure body 133 is plasticized or cured, and bonded to the first structure body 132 in the end portions where there is no element portion 170. The second structure body 133 is subjected to pressure bonding, whereby the second structure body 133 gets into the grooves 250 and the first structure body 132 and the second structure body 133 are physically fixed to each other in the grooves 250; therefore, adhesive strength can be enhanced. By this process, the element portion 170 including the light emitting element 140 can be sealed by the first structure body 132 and the second structure body 133 (see FIG. 17C). A step in which the structure body is subjected to pressure bonding is performed under an atmospheric pressure or a reduced pressure.

Accordingly, a light emitting device of this embodiment having a light emitting element sealed by the first structure body and the second structure body can be formed.

Figure 17C:
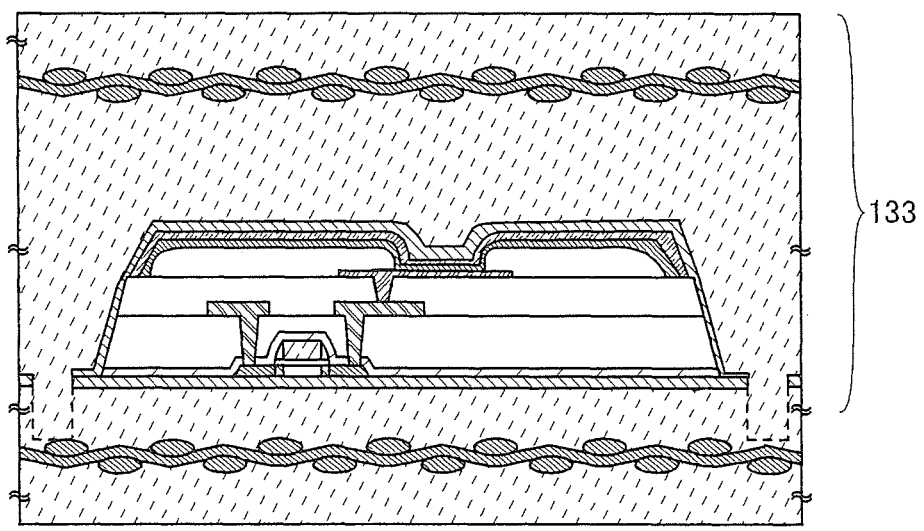

As illustrated in FIG. 17C, the element portion 170 is arranged in a substantially central portion in a cross section of the light emitting device, and in the end portions where there is no element portion 170, the first structure body 132 and the second structure body 133 are in contact with each other and fixed to each other, so that the element portion 170 is sealed.

In this manner, with the use of a pair of structure bodies that seals a light emitting element, a highly reliable light emitting device which is reduced in thickness and size and has tolerance can be provided. Further, a light emitting device can be manufactured with a high yield by preventing defects of a shape and characteristics due to external stress in a manufacture process.

As described in this embodiment, the grooves are formed in the first structure body 132, and the first structure body 132 is bonded to the second structure body 133, whereby adhesive strength between the first structure body 132 and the second structure body 133 can be improved and film separation can be prevented.

This embodiment can be freely combined with any of other embodiments.

Embodiment 10

In this embodiment, a modular light emitting device to which an FPC is connected will be described with reference to FIGS. 18A and 18B. FIG. 18A is a top view illustrating the light emitting device formed by the manufacturing method described in the above embodiment. In addition, FIG. 18B is a cross-sectional view taken along a line a-b of FIG. 18A.

The light emitting device illustrated in FIGS. 18A and 18B is formed by a method described in any of the above embodiments and includes a terminal portion 502 and the element portion 170 that is sealed by the first structure body 132 in which a fibrous body is impregnated with an organic resin and the second structure body 133 in which a fibrous body is impregnated with an organic resin. The element portion includes a light emitting element, a driver circuit used to drive the light emitting element, and a switching element used to supply potential to the light emitting element. The terminal portion 502 includes a wiring 504. The wiring 504 can be formed at the same time as a wiring included in the switching element in the element portion. Further, the terminal portion 502 is sealed by the first structure body and the second structure body at the same time as the element portion 170.

The wiring 504 provided in the terminal portion 502 receives a video signal, a clock signal, a start signal, a reset signal, or the like from a flexible printed circuit (FPC) 505 which serves as an external input terminal. Note that a structure in which a print circuit board (PWB) is attached to the FPC 505 illustrated in FIGS. 18A and 18B may be used. The light emitting device according to this specification includes not only a light emitting device body but also a state in which an FPC or a PWB is attached thereto.

In FIG. 18B, a through wiring 503 is formed in a position where the through wiring 503 is electrically connected to the wiring 504 provided in the terminal portion 502. The through-hole is formed in the first structure body 132 and the second structure body 133 by a laser, a drill, a punching needle, or the like, and a conductive resin is provided in the through-hole by screen-printing or an inkjet method, whereby the through wiring 503 can be formed. An organic resin in which a conductive particle having a grain size of several tens of micrometers or less is dissolved or dispersed is used for the conductive resin.

For the conductive particle, a conductive paste containing any of metal elements of copper (Cu), silver (Ag), nickel (Ni), gold (Au), platinum (Pt), palladium (Pd), tantalum (Ta), molybdenum (Mo), or titanium (Ti) can be used, for example. In addition, as an organic region contained in the conductive resin, one or more of organic resins functioning as a binder, a solvent, a dispersing agent, and a coating material for the metal particle can be used. Typically, an organic resin such as an epoxy resin, a phenolic resin, or a silicone resin can be used.

Alternatively, the through wiring 503 may be formed without a through-hole being formed in the first structure body 132 and the second structure body 133. For example, a conductive resin is placed in a predetermined position over the first structure body 132 or the second structure body 133; organic resins of the structure bodies are partly dissolved by the reaction of the organic resins included in the first structure body 132 and the second structure body 133 and an organic resin included in the conductive resin; and metal particles included in the conductive resin are impregnated with the first structure body 132 and the second structure body 133, whereby the through wiring 503 can be formed.

The FPC 505 to serve as an external input terminal is attached to the through wiring 503 provided in the first structure body 132 and the second structure body 133. Therefore, the wiring 504 provided in the terminal portion 502 and the FPC 505 are electrically connected to each other by using the conductive particles included in the through wiring 503.

Thus, a modular light emitting device to which the FPC 505 is connected can be obtained.

This embodiment can be freely combined with any of other embodiments.

Embodiment 11

A light emitting device described in the above embodiment can be used as a display portion of an electronic device. An electronic device described in this embodiment has the light emitting device of the above embodiment. By the method for manufacturing a light emitting device according to the above embodiment, a highly reliable light emitting device can be obtained with a high yield. As a result, an electronic device can be formed with good throughput and high quality as a final product.

The application range of the light emitting device found using the light emitting device described in the above embodiment is so wide that this light emitting device can be applied to electronic devices in all fields. The light emitting device can be used for display portions of various electronic devices such as a display device, a computer, a cellular phone, or a camera. The light emitting device described in the above embodiment is used for a display portion, whereby a thin electronic device with high reliability can be provided. An electronic device provided with the flexible light emitting device described in the above embodiment such as a display can become a highly reliable product which realizes portability and reduction in weight.

The light emitting device described in the above embodiment can also be used as a lighting system. One mode of using the light emitting element to which the above embodiment is applied as a lighting system will be described with reference to FIG. 19 and FIGS. 20A and 20B.

Figure 19:
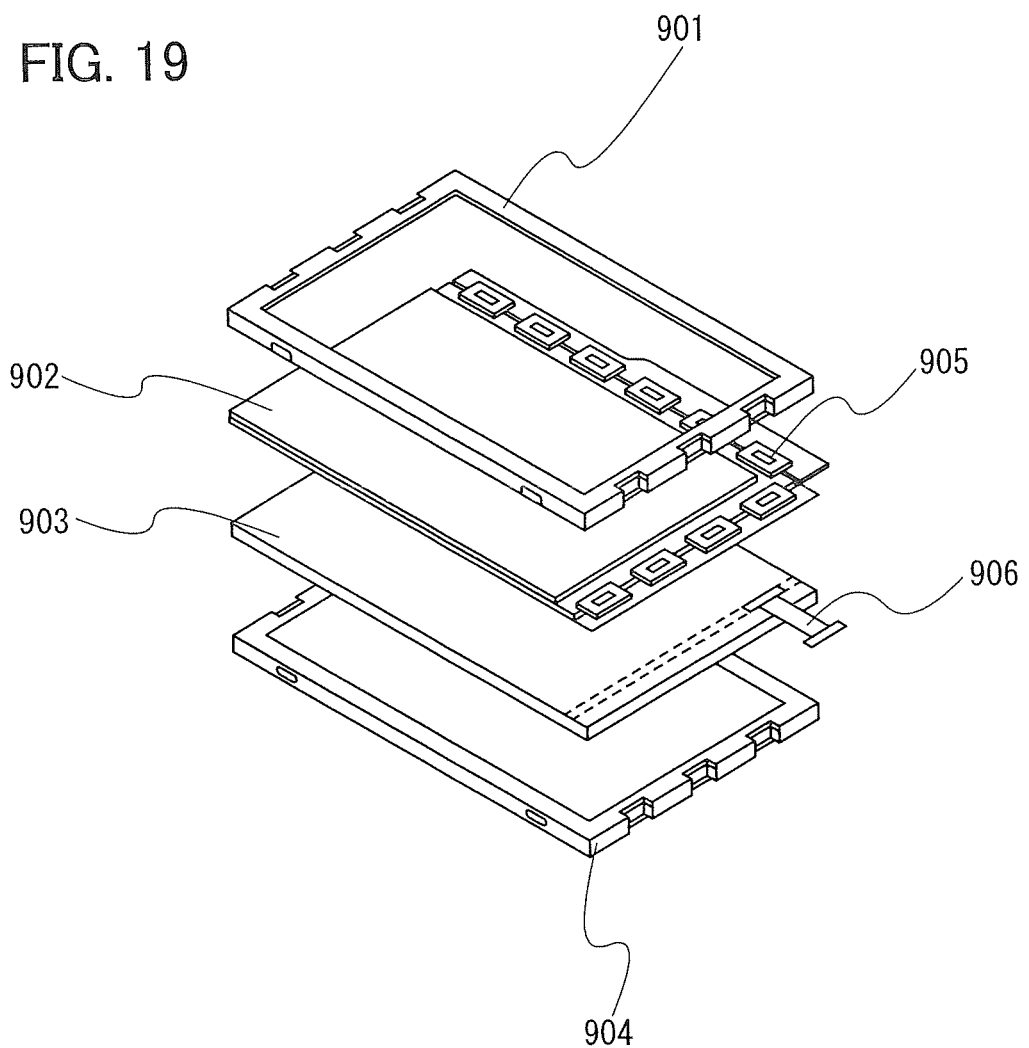
FIG. 19 illustrates an application example of a light emitting device according to an embodiment of the present invention.

FIG. 19 illustrates an example of a display device using the light emitting device to which the above embodiment is applied as a backlight. The display device illustrated in FIG. 19 includes a housing 901, a liquid crystal layer 902, a backlight 903, and a housing 904. The liquid crystal layer 902 is connected to a driver IC 905. The light emitting device described in the above embodiment is used as the backlight 903, and current is supplied through a terminal 906.

By using a light emitting device to which the above embodiment is applied as a backlight of a display device, a thin backlight with high reliability can be obtained. Accordingly, a thin display device can be provided. Needless to say, the light emitting device described in the above embodiment can also be used as a lighting system having a planar shape or a curved surface other than a backlight of a liquid crystal display device.

Figure 20A:
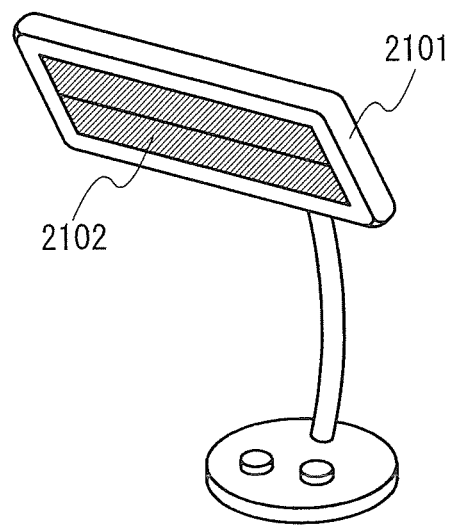
FIGS. 20A and 20B each illustrate an application example of a light emitting device according to an embodiment of the present invention.

FIG. 20A illustrates an example in which a light emitting device to which the above embodiment is applied is used as a desk lamp that is one of lighting systems. The desk lamp illustrated in FIG. 20A has a housing 2101 and a light source 2102. The light emitting device described in the above embodiment is used as the light source 2102.

Figure 20B:
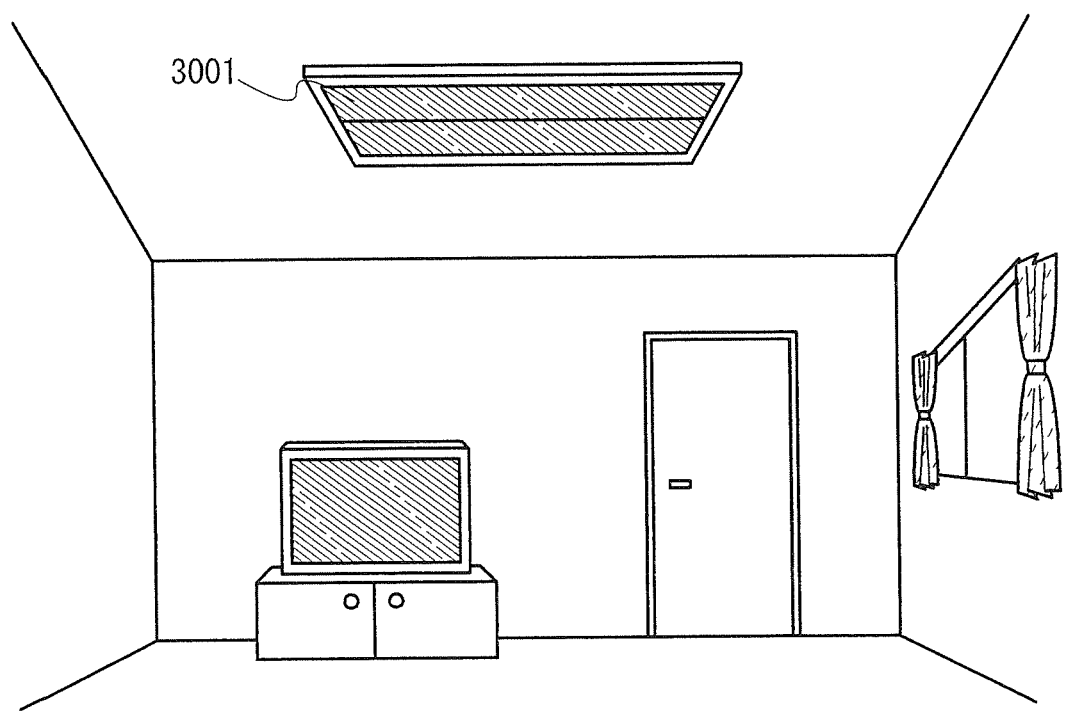

FIG. 20B illustrates an example in which a light emitting device to which the above embodiment is applied is used as an indoor lighting system 3001. The light emitting device of an embodiment of the present invention can be used as a thin lighting system. Further, this light emitting device can be flexible.

A lighting system is not limited to those illustrated in FIG. 19 and FIGS. 20A and 20B, and is applicable as a lighting system with various modes such as lighting for houses or public facilities. The light emitting medium of the lighting system of this embodiment is a thin film, which increases design freedom. Accordingly, various elaborately-designed products can be provided to the marketplace.

In this manner, according to the light emitting device described in the above embodiment, an electronic device with lower power consumption and high reliability can be provided. This embodiment can be freely combined with any of the above embodiments.

This application is based on Japanese Patent Application serial No. 2008-180781 filed with Japan Patent Office on Jul. 10, 2008, the entire contents of which are hereby incorporated by reference.

What is claimed is:
1. A light emitting device comprising:
   a polyimide resin;
   a first insulating layer over the polyimide resin;
   a transistor over the first insulating layer;
   a second insulating layer over the transistor, the second insulating layer comprising a first opening;
   a wiring over the second insulating layer, the wiring electrically connected to the transistor through the first opening;
   a third insulating layer over the wiring, the third insulating layer comprising a second opening;
   a first electrode over the third insulating layer, the first electrode electrically connected to the wiring through the second opening;

an EL layer over the first electrode;
a second electrode over the EL layer; and
a fourth insulating layer over the second electrode,
wherein the fourth insulating layer and the second insulating layer are in contact with each other.

2. The light emitting device according to claim 1, further comprising a polyimide resin over the fourth insulating layer.

3. The light emitting device according to claim 1, wherein the polyimide resin is impregnated with an organic resin, and
wherein the organic resin is between the polyimide resin and the first insulating layer.

4. The light emitting device according to claim 1, further comprising a first layer, wherein the polyimide resin is positioned over the first layer.

5. The light emitting device according to claim 4, wherein the first layer is an impact relief layer.

6. The light emitting device according to claim 1, wherein the first insulating layer and the second insulating layer are in contact with each other.

7. A light emitting device comprising:
a polyimide resin;
a first insulating layer over the polyimide resin;
a transistor over the first insulating layer;
a second insulating layer over the transistor, the second insulating layer comprising a first opening;
a wiring over the second insulating layer, the wiring electrically connected to the transistor through the first opening;
a third insulating layer comprising silicon nitride over the wiring, the third insulating layer comprising a second opening;
a first electrode over the third insulating layer, the first electrode electrically connected to the wiring through the second opening;
an EL layer over the first electrode;
a second electrode over the EL layer; and
a fourth insulating layer over the second electrode,
wherein the fourth insulating layer and the first insulating layer are in contact with each other.

8. The light emitting device according to claim 7, further comprising a polyimide resin over the fourth insulating layer.

9. The light emitting device according to claim 7, wherein the polyimide resin is impregnated with an organic resin, and
wherein the organic resin is between the polyimide resin and the first insulating layer.

10. The light emitting device according to claim 7, further comprising a first layer, wherein the polyimide resin is positioned over the first layer.

11. The light emitting device according to claim 10, wherein the first layer is an impact relief layer.

12. The light emitting device according to claim 7, wherein the first insulating layer and the second insulating layer are in contact with each other.

* * * * *